United States Patent
Shiomi et al.

(10) Patent No.: US 10,424,642 B2
(45) Date of Patent: Sep. 24, 2019

(54) SILICON CARBIDE SEMICONDUCTOR DEVICE

(71) Applicant: Sumitomo Electric Industries, Ltd., Osaka-shi (JP)

(72) Inventors: Hiromu Shiomi, Tsukuba (JP); Hidenori Kitai, Tsukuba (JP); Kenji Fukuda, Tsukuba (JP); Hideto Tamaso, Tsukuba (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/755,828

(22) PCT Filed: Sep. 8, 2016

(86) PCT No.: PCT/JP2016/076525
§ 371 (c)(1),
(2) Date: Feb. 27, 2018

(87) PCT Pub. No.: WO2017/043606
PCT Pub. Date: Mar. 16, 2017

(65) Prior Publication Data
US 2018/0331209 A1    Nov. 15, 2018

(30) Foreign Application Priority Data

Sep. 9, 2015  (JP) ................. 2015-177664
Sep. 9, 2015  (JP) ................. 2015-177685
Sep. 9, 2015  (JP) ................. 2015-177701

(51) Int. Cl.
*H01L 29/10*       (2006.01)
*H01L 29/66*       (2006.01)
(Continued)

(52) U.S. Cl.
CPC ........ *H01L 29/1095* (2013.01); *H01L 21/049* (2013.01); *H01L 21/0465* (2013.01);
(Continued)

(58) Field of Classification Search
CPC ............. H01L 29/0696; H01L 29/1095; H01L 29/66325; H01L 29/66333; H01L 29/6634;
(Continued)

(56) References Cited

U.S. PATENT DOCUMENTS 9,954,054 B2 *  4/2018  Shiomi ................. H01L 21/046
2008/0191238 A1 *  8/2008  Madathil ............. H01L 29/7397
257/133

(Continued)

FOREIGN PATENT DOCUMENTS

JP      2005-328014 A    11/2005
JP      2006-516815 A     7/2006
(Continued)

OTHER PUBLICATIONS

Harada et al., "4.3 mΩcm², 1100 V 4H-SiC Implantation and Epitaxial MOSFET," Materials Science Forum vols. 527-529 (2006) pp. 1281-1284.
(Continued)

*Primary Examiner* — Eduardo A Rodela
(74) *Attorney, Agent, or Firm* — Baker Botts L.L.P.; Michael A. Sartori

(57) ABSTRACT

The current diffusion layer is interposed between the divided portions of the first base region. The second base region is provided adjacent to both sides of the trench current diffusion layer. The body region is provided on the trench current diffusion layer and the second base region. The source region is provided on the body region. The trench is provided to extend from a surface of the source region to the
(Continued)

trench current diffusion layer through the source region and the body region. The trench has a bottom surface that is separated from and overlaps with the center portion of the first base region in a perpendicular direction. A width of the center portion in a horizontal direction is larger than a width of the bottom surface of the trench.

8 Claims, 30 Drawing Sheets

(51) Int. Cl.
    *H01L 29/06*     (2006.01)
    *H01L 29/739*     (2006.01)
    *H01L 29/423*     (2006.01)
    *H01L 29/78*     (2006.01)
    *H01L 29/16*     (2006.01)
    *H01L 21/04*     (2006.01)

(52) U.S. Cl.
    CPC ...... *H01L 29/0634* (2013.01); *H01L 29/0638* (2013.01); *H01L 29/0696* (2013.01); *H01L 29/1608* (2013.01); *H01L 29/4236* (2013.01); *H01L 29/66068* (2013.01); *H01L 29/66325* (2013.01); *H01L 29/7393* (2013.01); *H01L 29/7395* (2013.01); *H01L 29/7396* (2013.01); *H01L 29/7802* (2013.01); *H01L 29/7813* (2013.01)

(58) Field of Classification Search
    CPC ........... H01L 29/66348; H01L 29/7393; H01L 29/7395; H01L 29/7396; H01L 29/7397
    See application file for complete search history.

(56) References Cited

U.S. PATENT DOCUMENTS

| | | | |
|---|---|---|---|
| 2009/0206924 A1* | 8/2009 | Zeng | H01L 29/0634 327/581 |
| 2011/0291241 A1 | 12/2011 | Yoshikawa et al. | |
| 2013/0140582 A1 | 6/2013 | Kawakami et al. | |
| 2013/0168701 A1 | 7/2013 | Kiyosawa et al. | |
| 2013/0306983 A1* | 11/2013 | Nakano | H01L 29/0623 257/76 |
| 2014/0021489 A1 | 1/2014 | Hamada et al. | |
| 2014/0353678 A1 | 12/2014 | Kawakami et al. | |
| 2015/0048382 A1 | 2/2015 | Takeuchi et al. | |
| 2016/0133741 A1* | 5/2016 | Matsuki | H01L 29/7813 257/77 |
| 2016/0247910 A1* | 8/2016 | Suzuki | H01L 29/66068 |
| 2017/0084701 A1 | 3/2017 | Kitamura | |
| 2017/0141186 A1 | 5/2017 | Shiomi | |
| 2017/0263757 A1* | 9/2017 | Saikaku | H01L 29/0688 |

FOREIGN PATENT DOCUMENTS

| | | |
|---|---|---|
| JP | 2008-147232 A | 6/2008 |
| JP | 2008-177538 A | 7/2008 |
| JP | 2008-227238 A | 9/2008 |
| JP | 2009-289987 A | 12/2009 |
| JP | 2012-169385 A | 9/2012 |
| JP | 2012-195519 A | 10/2012 |
| JP | 2013-105798 A | 5/2013 |
| JP | 2014-154725 A | 8/2014 |
| JP | 2015-041719 | 3/2015 |
| WO | 2004/066392 A1 | 8/2004 |
| WO | 2012/049872 A1 | 4/2012 |
| WO | 2013/042333 A1 | 3/2013 |
| WO | 2013/136550 A1 | 9/2013 |
| WO | 2013/157259 A1 | 10/2013 |
| WO | 2015/049838 A1 | 4/2015 |
| WO | 2016/002766 A1 | 1/2016 |

OTHER PUBLICATIONS

Kawada et al., "Technique for Controlling Shape of Trench for SiC Power MOSFET," Fuji Electric Journal vol. 81, No. 6 (2008), pp. 454 (74)-457(77).

"SiC HTCVD Simulation Modified by Sublimation Etching," Denso Technical Review vol. 12, No. 2 (2007), pp. 151-154.

Yano et al., "Anomalously anisotropic channel mobility on trench sidewalls in 4 H—Si C trench-gate metal-oxide-semiconductor field-effect transistors fabricated on 8° off substrates," Applied Physics Letters, 90 (2007) 042102.

Nakano et al., "4H—SiC Trench Metal Oxide Semiconductor Field Effect Transistors with Low On-Resistance", Jpn. J. Appl. Phys. 48 (2009) 04C100.

Miyahara et al., "Effect of damage removal treatment after trench etching on the reliability of trench MOSFET," Mater. Sci. Forum vols. 740-742 (2013) pp. 789-792.

U.S. Appl. No. 15/755,892, filed Feb. 27, 2018.

Non-Final Office Action dated Jan. 31, 2019 in related U.S. Appl. No. 15/755,892.

Notice of Allowance dated Jun. 6, 2019 in related U.S. Appl. No. 15/755,892.

\* cited by examiner

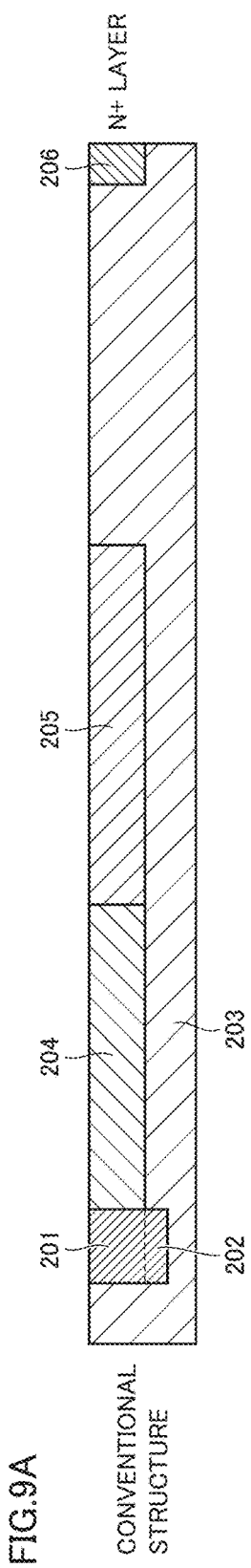

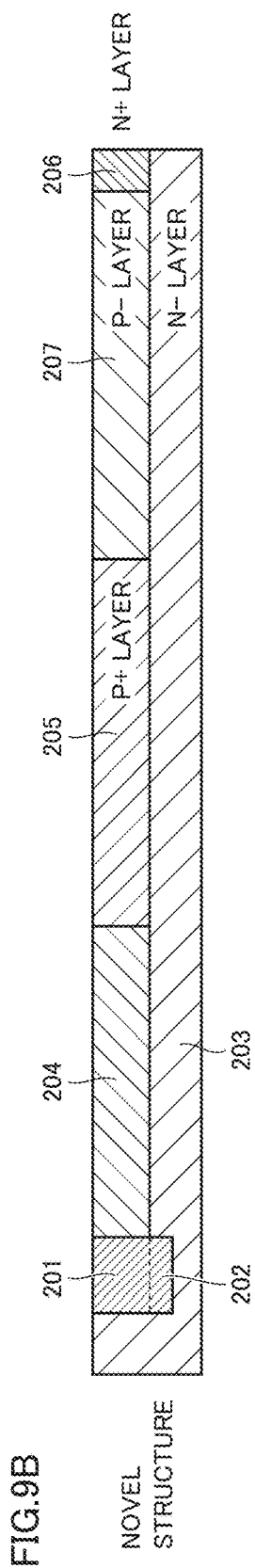

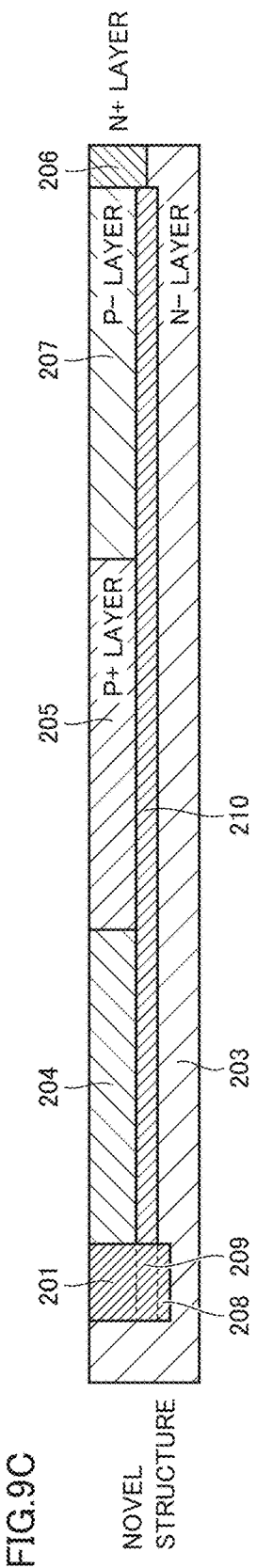

○ : ACTIVE SPECIES

▨ : SUB-TRENCH SUPPRESSING THIN FILM IS GENERATED BY REACTION OF MIXED GAS

SILICON CARBIDE SEMICONDUCTOR DEVICE

TECHNICAL FIELD

The present disclosure relates to a silicon carbide semiconductor device. The present application claims a priority based on Japanese Patent Application No. 2015-177664 filed on Sep. 9, 2015, Japanese Patent Application No. 2015-177685 filed on Sep. 9, 2015, and Japanese Patent Application No. 2015-177701 filed on Sep. 9, 2015, entire contents of which are hereby incorporated by reference. Moreover, the entire content of Japanese Patent Application No. 2014-134898 is also hereby incorporated by reference.

BACKGROUND ART

In order to drastically reduce switching loss, silicon carbide (SiC) power semiconductors have been used to control motors for various types of power supply devices including power supplies, photovoltaic converters, air conditioners, elevators, and railroad vehicles.

In order to avoid damage by embedding, an embedded epitaxial layer type MOSFET have been developed (Non-Patent Document 1) which employs a p type epitaxial layer having a low-concentration impurity implanted therein.

CITATION LIST

Patent Document

PTD 1: WO 2013/157259
PTD 2: Japanese Patent Laying-Open No. 2008-147232

Non Patent Document

NPD 1: S. Harada, M. Kato, M. Okamoto, T. Yatsuo, K. Fukuda, and K. Arai, Mater. Sci. Forum 527-529 (2006) 1281

SUMMARY OF INVENTION

A silicon carbide semiconductor device according to the present disclosure includes a substrate, a drift layer, a first base region, a trench current diffusion layer, a second base region, a body region, a source region, a contact region, a trench, a gate insulating oxide film, a gate electrode, a source electrode, and a drain electrode. The substrate has a first conductivity type and is composed of silicon carbide. The drift layer is provided on the substrate, has the first conductivity type, and is composed of silicon carbide. The first base region is provided on the drift layer, is divided into a center portion and side portions adjacent to both sides of the center portion, has a second conductivity type, and is composed of silicon carbide. The current diffusion layer is interposed between the divided portions of the first base region. The trench current diffusion layer is provided on the first base region and the current diffusion layer, has the first conductivity type, and is composed of silicon carbide. The second base region is provided adjacent to both sides of the trench current diffusion layer, has the second conductivity type, and is composed of silicon carbide. The body region is provided on the trench current diffusion layer and the second base region, has the second conductivity type, and is composed of silicon carbide. The source region is provided on the body region, has the first conductivity type, and is composed of silicon carbide. The contact region has the second conductivity type, and is composed of silicon carbide. The trench is provided to extend from a surface of the source region to the trench current diffusion layer through the source region and the body region. The gate insulating oxide film is provided to cover an inner wall surface of the trench and a portion of the source region. The gate electrode is provided in the trench. The source electrode covers a portion of the source region and the contact region, and is electrically connected to the body region. The drain electrode is provided on a backside surface of the substrate. The trench has a bottom surface that is separated from and overlaps with the center portion of the first base region in a perpendicular direction. A width of the center portion in a horizontal direction is larger than a width of the bottom surface of the trench.

BRIEF DESCRIPTION OF DRAWINGS

FIG. 9A shows a semiconductor outer circumferential structure in a conventional structure.

FIG. 9B shows a semiconductor outer circumferential structure of an embodiment 2-1 of the present disclosure.

FIG. 9C shows a semiconductor outer circumferential structure of a modification of embodiment 2-1 of the present disclosure.

DESCRIPTION OF EMBODIMENTS

Figure 1A:
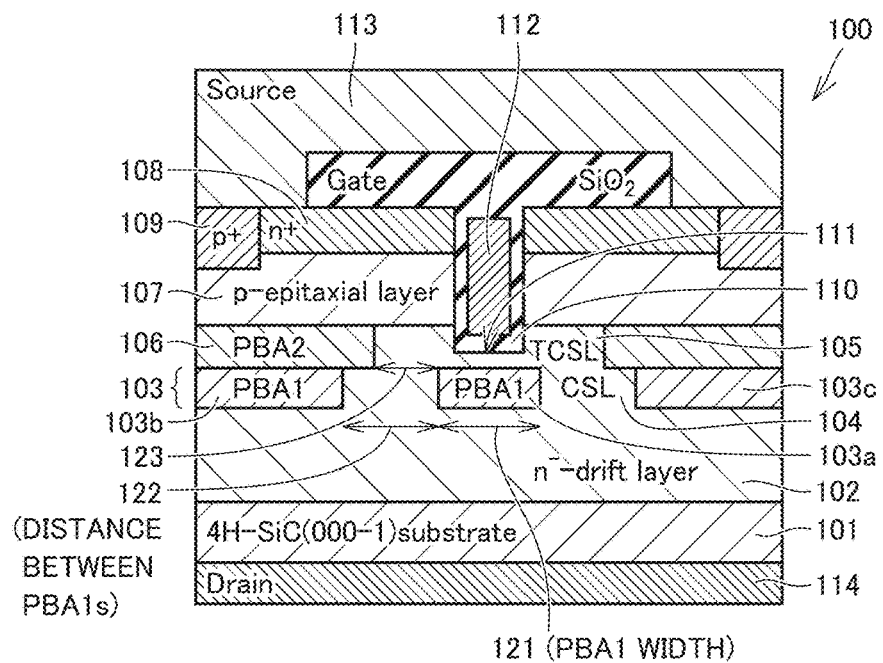
FIG. 1A is a cross sectional view of a first example of a SiC trench type semiconductor device of the present disclosure.

[Problem to be Solved by the Present Disclosure]

A SiC trench type MOSFET, which has high cell density and high channel mobility at a trench side wall, is expected to have a low on resistance. At the same time, however, an electric field is expected to be high in a p epitaxial layer that forms a channel having a high channel mobility together with a gate oxide film at the bottom of the trench. The high electric field causes problems in terms of reliability of the gate oxide film as well as punch through of a p− epitaxial layer having a high channel mobility and having a low-concentration impurity implanted therein.

In production of SiC trench type MOSFETs, a SiC trench type MOSFET can be produced to have a high breakdown voltage but it is difficult to attain a low on resistance (Non-Patent Document 1). Moreover, it is difficult to suppress breakdown at a high breakdown voltage while achieving a low on resistance (Patent Document 1 and Patent Document 2). It is difficult to achieve both a high breakdown voltage and a low on resistance. The present disclosure has an object to suppress breakdown at a high breakdown voltage and achieve a low on resistance.

[Advantageous Effect of the Present Disclosure]

In the present disclosure, in order to protect a bottom of a trench of a SiC trench type semiconductor device, a p base layer is embedded in an n− drift layer directly below the bottom of the trench so as to be separated from the bottom of the trench. Moreover, a high breakdown voltage and a low on resistance are achieved by optimizing various characteristics around a source region and a channel region. The embedded p base layer formed directly below the bottom of the trench and separated from the bottom of the trench can serve to efficiently reduce a high electric field concentrated on a gate oxide film. Moreover, the low on resistance can be achieved by a channel layer and a trench current diffusion layer respectively constituted of a p− epitaxial layer and an n− epitaxial layer.

[Description of Embodiments]

First, embodiments of the present disclosure are listed and described.

(1) A silicon carbide semiconductor device according to the present disclosure includes a substrate, a drift layer, a first base region, a trench current diffusion layer, a second base region, a body region, a source region, a contact region, a trench, a gate insulating oxide film, a gate electrode, a source electrode, and a drain electrode. The substrate has a first conductivity type and is composed of silicon carbide. The drift layer is provided on the substrate, has the first conductivity type, and is composed of silicon carbide. The first base region is provided on the drift layer, is divided into a center portion and side portions adjacent to both sides of the center portion, has a second conductivity type, and is composed of silicon carbide. The current diffusion layer is interposed between the divided portions of the first base region. The trench current diffusion layer is provided on the first base region and the current diffusion layer, has the first conductivity type, and is composed of silicon carbide. The second base region is provided adjacent to both sides of the trench current diffusion layer, has the second conductivity type, and is composed of silicon carbide. The body region is provided on the trench current diffusion layer and the second base region, has the second conductivity type, and is composed of silicon carbide. The source region is provided on the body region, has the first conductivity type, and is composed of silicon carbide. The contact region has the second conductivity type, and is composed of silicon carbide. The trench is provided to extend from a surface of the source region to the trench current diffusion layer through the source region and the body region. The gate insulating oxide film is provided to cover an inner wall surface of the trench and a portion of the source region. The gate electrode is provided in the trench. The source electrode covers a portion of the source region and the contact region, and is electrically connected to the body region. The drain electrode is provided on a backside surface of the substrate. The trench has a bottom surface that is separated from and overlaps with the center portion of the first base region in a perpendicular direction. A width of the center portion in a horizontal direction is larger than a width of the bottom surface of the trench.

(2) In the silicon carbide semiconductor device according to (1), the bottom surface of the trench may be separated from the center portion by equal to or more than 0.05 μm and equal to or less than 0.5 μm in the perpendicular direction.

(3) In the silicon carbide semiconductor device according to (2), the width of the center portion in the horizontal direction may be larger than the width of the bottom surface of the trench by equal to or more than 0.1μ and equal to less than 0.5 μm.

(4) In the silicon carbide semiconductor device according to (3), an impurity concentration of the current diffusion layer may be equal to or more than $1.0 \times 10^{16}$ cm$^{-3}$ and equal to or less than $4.0 \times 10^{17}$ cm$^{-3}$, a width of the current diffusion layer in the horizontal direction between the center portion and each of the side portions of the first base region may be equal to or more than 0.7 μm and equal to or less than 1.5 μm.

(5) In the silicon carbide semiconductor device according to (4), a thickness of the body region in the perpendicular direction may be equal to or more than 0.5 μm and equal to or less than 1.5 μm, and an impurity concentration of the body region may be equal to or more than $1.0 \times 10^{16}$ cm$^{-3}$ and equal to or less than $3.0 \times 10^{17}$ cm$^{-3}$. A thickness of the source region in the perpendicular direction may be equal to or more than 0.1 μm and equal to or less than 0.4 μm, and an impurity concentration of the source region may be equal to or more than $2.0 \times 10^{18}$ cm$^{-3}$ and equal to or less than $1.0 \times 10^{20}$ cm$^{-3}$. A thickness of the trench current diffusion layer in the perpendicular direction may be equal to or more than 0.3 μm and equal to or less than 1.0 μm. An impurity concentration of the trench current diffusion layer may be equal to or more than $5.0 \times 10^{16}$ cm$^{-3}$ and equal to or less than $1.0 \times 10^{17}$ cm$^{-3}$.

(6) In the silicon carbide semiconductor device according to any one of (2) to (5), a first separation distance between the center portion of the first base region and each of the side portions of the first base region in the horizontal direction may be larger than a second separation distance between the center portion of the first base region and an end portion of the second base region in the horizontal direction. A difference between the first separation distance and the second separation distance may be equal to or more than 0.2 μm and may be equal to or less than a thickness of the first base region and equal to or less than 0.6 μm.

(7) In the silicon carbide semiconductor device according to (6), the center portion of the first base region may be connected to each of the side portions of the first base region by first base region connection portions. The first base region connection portions may be cyclically provided in a long side direction of the first base region.

(8) In the silicon carbide semiconductor device according to (7), an interval between two adjacent first base region connection portions of the first base region connection portions in the long side direction may be equal to or more than 10 μm and equal to or less than 200 μm.

[Details of Embodiments]

Next, the following describes details of the embodiments of the present disclosure. It should be noted that the same or corresponding portions in the figures are given the same reference characters. Moreover, at least a part of the embodiments described below may be combined.

<First Embodiment>

(Embodiment 1-1)

Figure 1B:
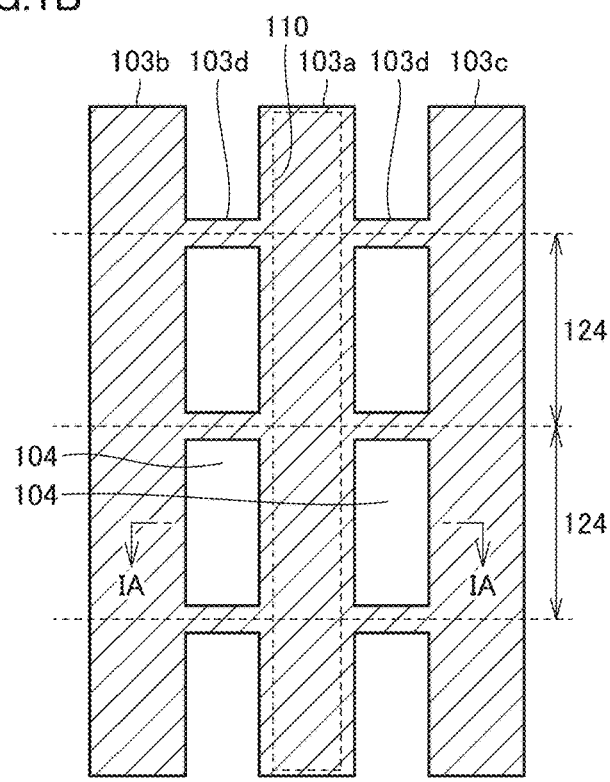
FIG. 1B is a cross sectional view of a first base region of the SiC trench type semiconductor device of the present disclosure along an IB-IB line in FIG. 2K.
Figure 2A:
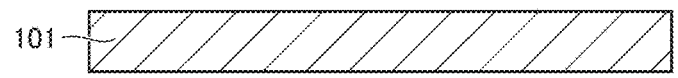
FIG. 2A shows a first step of manufacturing the SiC trench type semiconductor device.
Figure 2B:
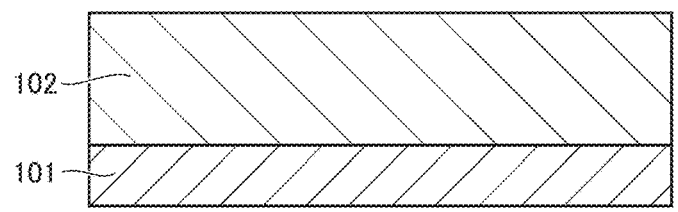
FIG. 2B shows a second step of manufacturing the SiC trench type semiconductor device.
Figure 2C:
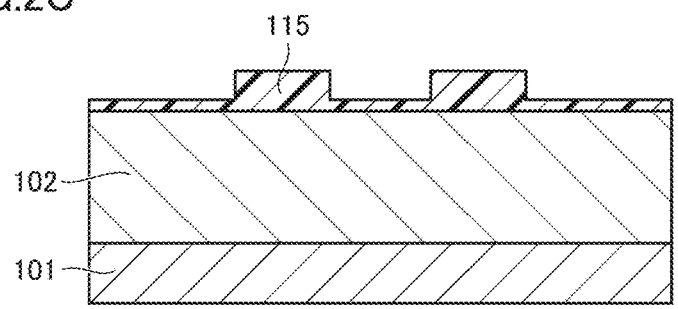
FIG. 2C shows a third step of manufacturing the SiC trench type semiconductor device.
Figure 2D:
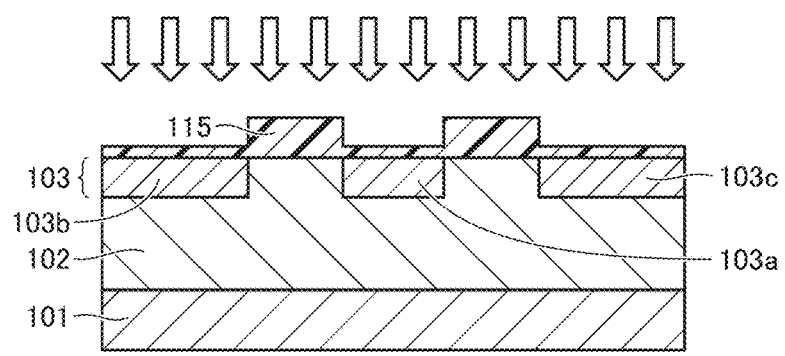
FIG. 2D shows a fourth step of manufacturing the SiC trench type semiconductor device.
Figure 2E:
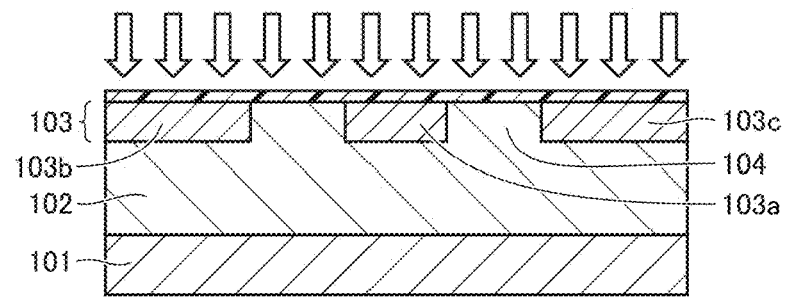
FIG. 2E shows a fifth step of manufacturing the SiC trench type semiconductor device.
Figure 2F:
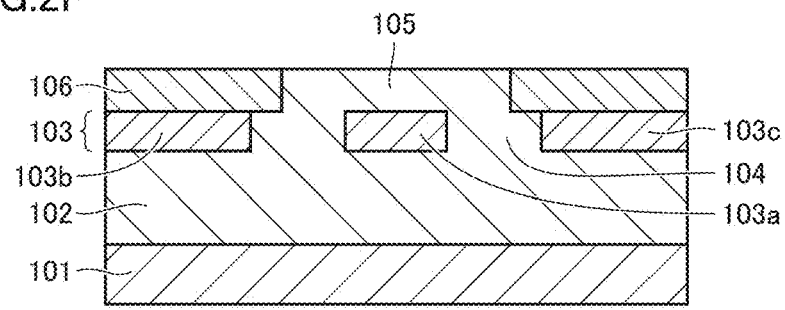
FIG. 2F shows a sixth step of manufacturing the SiC trench type semiconductor device.
Figure 2G:
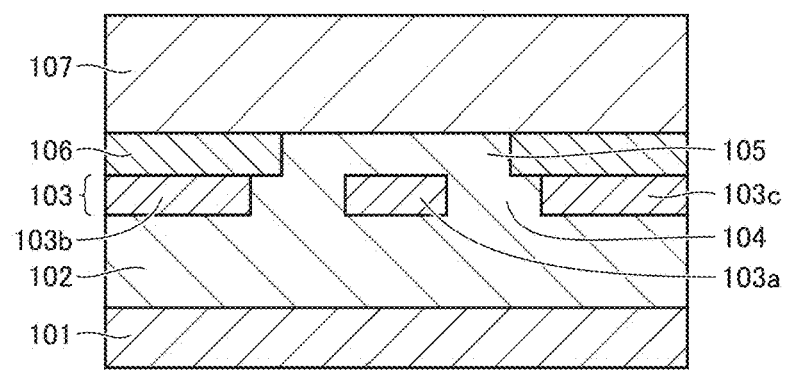
FIG. 2G shows a seventh step of manufacturing the SiC trench type semiconductor device.
Figure 2H:
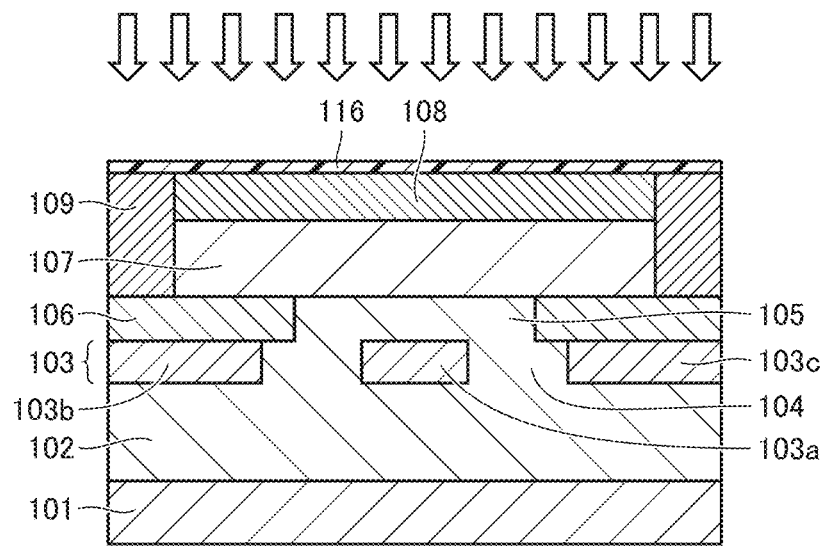
FIG. 2H shows an eighth step of manufacturing the SiC trench type semiconductor device.
Figure 2I:
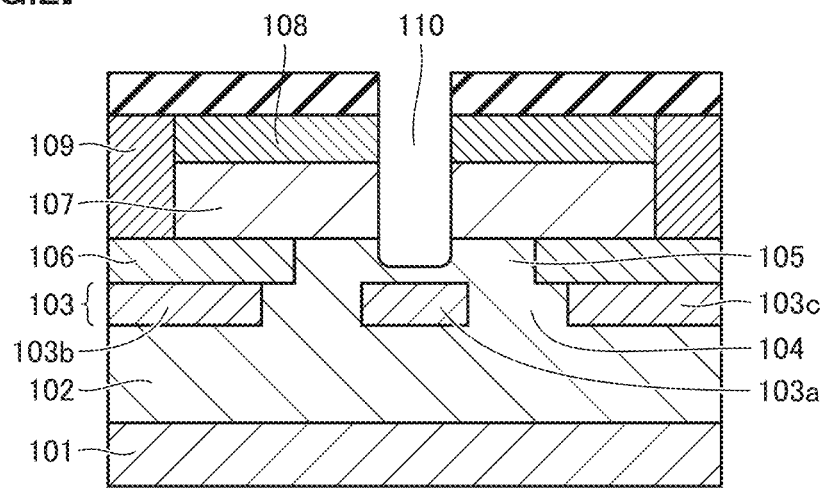
FIG. 2I shows a ninth step of manufacturing the SiC trench type semiconductor device.
Figure 2J:
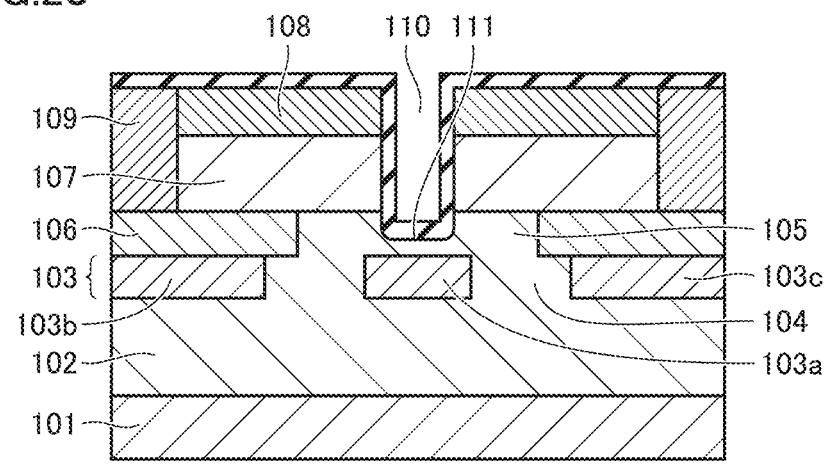
FIG. 2J shows a tenth step of manufacturing the SiC trench type semiconductor device.
Figure 2K:
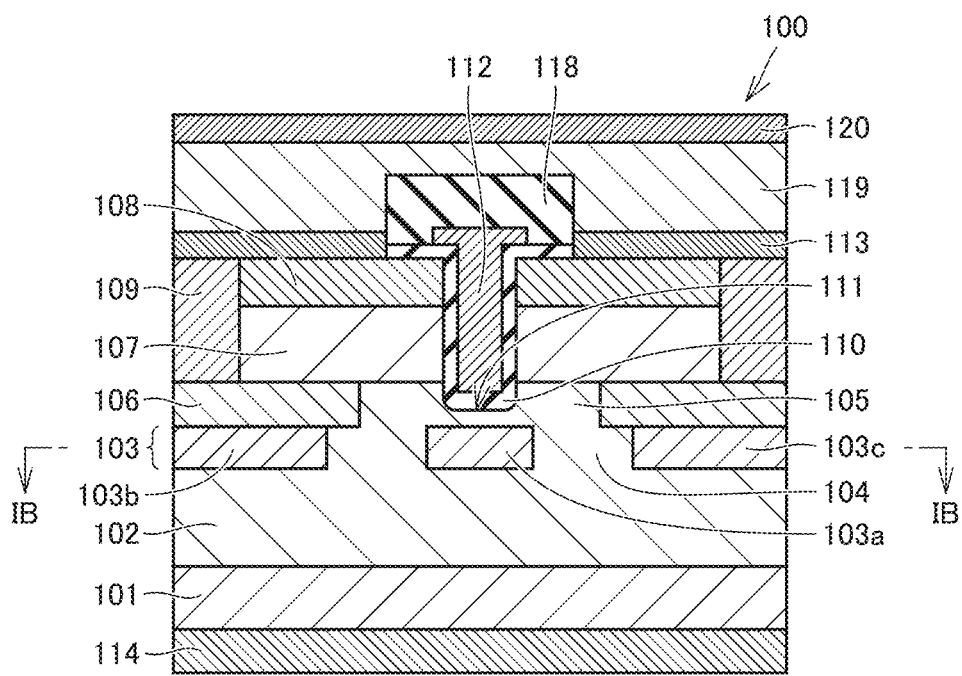
FIG. 2K is a cross sectional view showing a second example of the SiC trench type semiconductor device.

Each of FIG. 1A, FIG. 1B, and FIG. 2K shows a configuration of a SiC trench type semiconductor device (silicon carbide trench type MOSFET (Metal Oxide Semiconductor Field Effect Transistor)) of the present disclosure.

The SiC trench type semiconductor device includes a substrate 101, a drift layer 102, a first base region 103 (PBA1), a current diffusion layer 104, a trench current diffusion layer 105, a second base region 106 (PBA2), a body region 107, a source region 108, a contact region 109, a trench 110, an insulating oxide film 111 (gate insulating film), a gate electrode 112, a source electrode 113, and a drain electrode 114. First base region 103 has a first base region center portion 103a, a first base region left side portion 103b, a first base region right side portion 103c, and first base region connection portions 103d.

Substrate 101 is composed of silicon carbide. Substrate 101 has a first conductivity type. Drift layer 102 is formed on the substrate. Drift layer 102 is composed of silicon carbide. Drift layer 102 has a first conductivity type (n type) and has a low impurity concentration. First base region 103 and current diffusion layer 104 are formed on drift layer 102. First base region 103 is composed of silicon carbide. First base layer 103 has a second conductivity type (p type) and has a high impurity concentration. When viewed in a cross section, first base region 103 is divided into the center portion and the side portions adjacent to both sides of the center portion. First base region left side portion 103b and first base region right side portion 103c are located adjacent to the both sides of first base region center portion 103a. Current diffusion layer 104 is interposed between the divided portions of first base region 103.

Trench current diffusion layer 105 and second base region 106 are formed on first base region 103 and current diffusion layer 104. Trench current diffusion layer 105 is composed of silicon carbide. Trench current diffusion layer 105 has the first conductivity type and has a high impurity concentration. Second base region 106 is formed adjacent to the both sides of trench current diffusion layer 105. Second base region 106 is composed of silicon carbide. Second base region 106 has the second conductivity type and has a high impurity concentration.

Body region 107 is formed on trench current diffusion layer 105 and second base region 106. Body region 107 is composed of silicon carbide. Body region 107 has the second conductivity type. Source region 108 is formed on body region 107. Source region 108 is composed of silicon carbide. Source region 108 has the first conductivity type and has a high impurity concentration. Source region 108 is formed adjacent to both sides of body region 107. Contact region 109 is composed of silicon carbide. Contact region 109 has substantially the same height as that of source region 108. Contact region 109 has the second conductivity type and has a high impurity concentration.

Trench 110 is formed to substantially perpendicularly extend from a surface of source region 108 to trench current diffusion layer 105 through source region 108 and body region 107. Gate insulating oxide film 111 is formed to cover an inner wall surface of trench 110 and a portion of source region 108. Within trench 110, gate electrode 112 is formed in the insulating oxide film. The gate electrode is provided in the trench. Source electrode 113 covers a portion of source region 108 and contact region 109. Source electrode 113 is electrically connected to body region 107. Drain electrode 114 is formed on the backside surface of substrate 101.

The bottom surface of trench 110 is separated from and overlaps with center portion 103a of divided first base region 103 in the perpendicular direction. The width of center portion 103a in the horizontal direction (direction parallel to the bottom surface of the trench) is larger than the width of the bottom surface of trench 110.

The bottom surface of trench 110 may be separated from center portion 103a of first base region 103 in the perpendicular direction by equal to or more than 0.05 µm and equal to or less than 0.5 µm. The width of center portion 103a in the horizontal direction may be larger than the width of the bottom surface of trench 110 by equal to or more than 0.1 µm and equal to or less than 0.5 µm. Current diffusion layer 104 may have an impurity concentration equal to or more than $1.0 \times 10^{16}$ cm$^{-3}$ and equal to or less than $4.0 \times 10^{17}$ cm$^{-3}$. The width of current diffusion layer 104 in the horizontal direction between center portion 103a of first base region 103 and each of the side portions of first base region 103 (first base region left side portion 103b or first base region right side portion 103c) may be equal to or more than 0.7 µm and equal to or less than 1.5 µm.

The thickness of body region 107 in the perpendicular direction (direction perpendicular to the bottom surface of the trench) may be equal to or more than 0.5 µm and equal to or less than 1.5 µm. The impurity concentration of body region 107 may be equal to or more than $1.0 \times 10^{16}$ cm$^{-3}$ and equal to or less than $3.0 \times 10^{17}$ cm$^{-3}$. The thickness of the source region in the perpendicular direction may be equal to or more than 0.1 µm and equal to or less than 0.4 µm. The impurity concentration of the source region may be equal to or more than $2.0 \times 10^{18}$ cm$^{-3}$ and equal to or less than $1.0 \times 10^{20}$ cm$^{-3}$. The thickness of trench current diffusion layer 105 in the perpendicular direction may be equal to or more than 0.3 µm and equal to or less than 1.0 µm. The impurity concentration of trench current diffusion layer 105 may be equal to or more than $5.0 \times 10^{16}$ cm$^{-3}$ and equal to or less than $1.0 \times 10^{17}$ cm$^{-3}$.

A separation distance 122 (first separation distance) corresponding to current diffusion layer 104 between first base region center portion 103a and each of the side portions of the first base region (first base region left side portion 103b or first base region right side portion 103c) may be larger than a separation distance 123 (second separation distance) corresponding to current diffusion layer 104 between first base region center portion 103a and each of side portions of second base region 106 in the horizontal direction. A difference between separation distance 122 and separation distance 123 in the horizontal direction may be equal to or more than 0.2 µm and may be equal to or less than the thickness of the first base region and equal to or less than 0.6 µm.

First base region center portion 103a may be connected cyclically to first base region left side portion 103b in the long side direction by first base region connection portions 3d (see FIG. 1B). First base region center portion 103a may be connected cyclically to first base region right side portion 103c in the long side direction by first base region connection portions 3d. A connection interval between adjacent first base region connection portions 3d in the long side direction of the first base region (i.e., an interval between two first base region connection portions adjacent to each other in the long side direction) may be equal to or more than 10 µm and equal to or less than 200 µm.

Next, with reference to FIG. 2A to FIG. 2K, the following describes a method for manufacturing the SiC trench type semiconductor device.

FIG. 2A shows production of a 4H-SiC substrate. First, a 4H-SiC {0001} substrate with 150 mmϕ is prepared. This substrate is produced by slicing an ingot grown by a Modified-Lely method and mirror-polishing it. The substrate has a resistivity of 0.017 Ωcm and has a thickness of 400 µm.

FIG. 2B shows production of the drift layer through SiC epitaxial growth. A CVD (Chemical Vapor Deposition) device is employed to produce the drift layer for an element having a breakdown voltage of 1200 V. The drift layer is produced on substrate 101 and has a nitrogen dope concentration of $8 \times 10^{15}$ cm$^{-3}$ and a film thickness of 10 µm. A substrate temperature is set at 1550° C., silane and propane are employed for source material gas, nitrogen is employed for dopant gas, hydrogen is employed for carrier gas, and a pressure is set at 100 mbar (10 kPa).

FIG. 2C shows formation of a mask for ion implantation. For example, a TEOS oxide film 115 having a film thickness of 1.6 µm is formed. By RF etching (CHF$_3$+O$_2$), TEOS oxide film 115 is etched at its portions via which implantation is to be performed, such that an 80-nm through film remains thereon.

FIG. 2D shows a step of producing first base region 103 in drift layer 102 on the substrate by performing Al ion implantation via the through film. Using the predetermined mask for producing first base region center portion 103a, the Al ion implantation is performed up to a depth equal to or more than 0.5 and equal to or less than 1.5 µm with a concentration equal to or more than $2 \times 10^{18}$ cm$^{-3}$ and equal to or less than $9 \times 10^{18}$ cm$^{-3}$.

FIG. 2E shows a step of producing current diffusion layer 104 by removing the mask oxide film for producing first base region 103, forming an 80-nm through film again, and then implanting nitrogen ions via the through film. The concentration of current diffusion layer 104 is equal to or more than $2 \times 10^{16}$ cm$^{-3}$ and equal to or less than $2 \times 10^{17}$ cm$^{-3}$. When the concentration is less than $2 \times 10^{16}$ cm$^{-3}$, resistance becomes high, with the result that current diffusion layer 104 cannot function as a current diffusion layer. When the concentration is more than $2 \times 10^{17}$ cm$^{-3}$, avalanche dielectric breakdown occurs between current diffusion layer 104 and first base region 103. The concentration of current diffusion layer 104 is more preferably equal to or more than $3 \times 10^{16}$ cm$^{-3}$ and equal to or less than $1 \times 10^{17}$ cm$^{-3}$. The width of current diffusion layer 104 in the horizontal direction is desirably equal to or more than 0.7 µm and equal to or less than 1.5 µm. Current diffusion layer 104 is formed by implanting nitrogen ions into drift layer 102.

FIG. 2F shows a step of producing the n type epitaxial film (trench current diffusion layer 105) having a predetermined concentration and having a thickness equal to or more than 0.3 µm and equal to or less than 1.0 µm and then producing second base region 106. The concentration of trench current diffusion layer 105 is equal to or more than $2 \times 10^{16}$ cm$^{-3}$ and equal to or less than $2 \times 10^{17}$ cm$^{-3}$. When the concentration is less than $2 \times 10^{16}$ cm$^{-3}$, resistance becomes high, with the result that trench current diffusion layer 105 cannot function as a trench current diffusion layer. When the concentration is more than $2 \times 10^{17}$ cm$^{-3}$, the following adverse effect is resulted: a threshold value of a channel formed in the p epitaxial layer is decreased. The concentration is more desirably equal to or more than $5 \times 10^{16}$ cm$^{-3}$ and equal to or less than $1 \times 10^{17}$ cm$^{-3}$. The thickness of trench current diffusion layer 105 is desirably equal to or more than 0.3 µm and equal to or less than 1.0 µm. When the thickness is less than 0.3 µm, resistance for current to be diffused in the lateral direction becomes high, with the result that trench current diffusion layer 105 cannot function as a trench current diffusion layer. When the thickness is more than 1.0 µm, electric field from the drift layer enters the oxide film in the trench, thus resulting in deteriorated reliability of the oxide film. Trench current diffusion layer 105 can be produced only through epitaxial growth with the concentration thereof being adjusted; however, the film can be formed through epitaxial growth and then the concentration thereof can be controlled by ion implantation. The production only through the epitaxial growth is desirable because there is no ion implantation damage and the resistance of trench current diffusion layer 105 is decreased. In the case where the concentration is optimized through ion implantation after the epitaxial growth, the concentration of an upper portion of trench current diffusion layer 5 close to an exit portion of the channel is increased to facilitate current to be diffused from the channel, and the concentration of a lower portion of trench current diffusion layer 105 near the first base region is decreased, thereby suppressing occurrence of avalanche dielectric breakdown resulting from entrance of electric field from between the portions of the first base region. Second base region 106 is produced at the both sides by performing Al ion implantation using a predetermined mask (not shown) up to a depth equal to or more than 0.5 µm and equal to or less than 1.0 µm with a concentration equal to or more than $2 \times 10^{18}$ cm$^{-3}$ and equal to or less than $9 \times 10^{18}$ cm$^{-3}$.

FIG. 2G shows production of a p type epitaxial film for body region 107. The p type epitaxial film has a concentration equal to or more than $1 \times 10^{16}$ cm$^{-3}$ and equal to or less than $3 \times 10^{17}$ cm$^{-3}$ and has a thickness equal to or more than 0.5 µm and equal to or less than 1.5 µm, desirably, equal to or more than 0.7 µm and equal to or less than 1.3 µm. When the thickness is less than 0.7 µm, a short channel effect occurs. On the other hand, when the thickness is larger than 1.3 µm, the channel resistance becomes too large. Alternatively, an n epitaxial layer may be formed and a portion thereof may be converted into a p layer through ion implantation.

FIG. 2H shows production of source region 8 and contact region 109. Source region 108 is produced by implanting phosphorus ions into the p type epitaxial film for body region 107. High-concentration n type source region 108 is formed up to a depth equal to or more than 0.1 µm and equal to or less than 0.4 µm to have a concentration equal to or more than $2 \times 10^{18}$ cm$^{-3}$ and equal to or less than $1 \times 10^{20}$ cm$^{-3}$. When the concentration thereof is smaller than this concentration, contact resistance of the source electrode is increased. When the concentration thereof is larger than this concentration, not only crystallinity is deteriorated to result in increased leakage current but also a substantial channel length becomes short due to diffusion of the impurity through the ion implantation, with the result that the threshold value is decreased.

Next, an oxide mask for forming contact region 109 is formed and then Al ions are partially implanted to produce contact region 109. A high-concentration p type contact region is formed up to a depth equal to or more than 0.1 µm and equal to or less than 1.5 µm to have a concentration equal to or more than $2 \times 10^{18}$ cm$^{-3}$ and equal to or less than $10 \times 10^{18}$ cm$^{-3}$. The ion implantation is preferably performed up to the depth of the p− layer, and is more desirably performed deeply up to the depth of the p+ layer. Then, the surface oxide film is removed, a protective film is formed, and activation annealing is performed in an Ar atmosphere. The activation annealing is performed at a temperature equal to or more than 1600° C. and equal to or less than 1750° C. for equal to or more than 5 minutes and equal to or less than 30 minutes.

FIG. 2I shows formation of trench 110. First, a TEOS oxide film having a film thickness of 1.6 µm is formed as an etching mask, and RF etching (CHF$_3$+O$_2$) is employed to form an opening for trench etching. Then, trench 110 is formed by etching using SF$_6$ and O$_2$ gas with the oxide film being used as a mask.

The bottom portion of the trench is exposed to the n type epitaxial film (trench current diffusion layer 105), is not in contact with first base region center portion 103a directly below the trench, and overlaps with the first base region center portion when viewed from above the trench. The first base region center portion has both sides equally overhanging relative to the bottom portion of the trench. The trench has a depth equal to or more than 0.5 µm and equal to or less than 2.3 µm. The trench has a width equal to or more than 0.5 µm and equal to or less than 3 µm. The bottom portion of the trench is separated from first base region center portion 103a by a separation distance equal to or more than 0.05 µm and equal to or less than 0.5 µm.

FIG. 2J shows a step of producing gate insulating oxide film 11. Insulating oxide film 111 is produced at a temperature equal to or more than 1100° C. and equal to or less than 1370° C. through O$_2$ dry oxidation to have a thickness equal to or more than 50 nm and equal to or less than 150 nm. Then, annealing is performed for equal to or more than 30 minutes and equal to or less than 360 minutes using N$_2$O (N$_2$ 10% diluted) at a temperature equal to or more than 1100° C. and equal to or less than 1370° C. Alternatively, an oxide film is deposited to have a thickness equal to or more than 50 nm and equal to or less than 150 nm and then is annealed under the same conditions.

FIG. 2K shows a completed SiC trench type semiconductor device of the present disclosure. Gate electrode 112 composed of polysilicon is produced, source electrode 113 is formed through Ni/Ti sputtering, and then RTA (Rapid Thermal Anneal) is performed at 1000° C. for 2 minutes.

Further, an interlayer insulating film 118 composed of TEOS/PSG is produced. Next, AlSi is formed through sputtering to serve as a source interconnection 119. Next, a protective film 120 constituted of a nitride film/polyimide is produced. Finally, drain electrode 114 is produced, thus completing the SiC semiconductor device of the present disclosure.

In the silicon carbide trench type MOSFET configured as described above, when positive voltage is applied to gate electrode 112, an inversion layer is formed in the vicinity of an interface of the p type silicon carbide channel layer (body region 107) that is in contact with gate insulating film 111 on the side wall of trench 110, whereby the MOSFET is turned on. Electrons flowing from the channel are diffused in trench current diffusion layer 105, flow between the portions of first base region 103 and then flow into drift layer 102. Since the conductivity of trench current diffusion layer 105 and the conductivity of current diffusion layer 104 are high, the on resistance can be low.

On the other hand, when voltage is not applied to gate electrode 112, electric field is applied to a depletion layer expanding between the embedded region (p base region) and drift layer 102. Since gate oxide film 111 is separated by trench current diffusion layer 105, high electric field is not applied thereto upon occurrence of avalanche. Moreover, since source region 108 is separated from the embedded region by body region 107, electric field in source region 108 is relaxed, whereby occurrence of avalanche due to punch through can be suppressed even when the concentration of source region 108 is decreased.

In the present disclosure, first base region center portion 103a constituted of the p base layer is embedded in n− drift layer 102 directly below the bottom of the trench of the SiC trench type semiconductor device so as to be separated from the bottom of the trench and protect the bottom of the trench. Hence, in the present disclosure, the oxide film is formed on trench current diffusion layer 105 having a low concentration and constituted of an epitaxial layer.

With this, the following problem can be avoided advantageously: if high-temperature heat treatment for forming the oxide film is performed in such a state that first base region center portion 103a serving as an ion implantation layer is not separated from the bottom of the trench and is exposed at the bottom of the trench, the ion implantation layer has a rough surface due to bunching, thus resulting in a local electric field concentrate, which leads to decreased breakdown voltage, increased leakage current, and the like.

Moreover, when first base region center portion 103a is separated from the bottom of the trench, trench current diffusion layer 105 serving as a low-concentration n layer is sandwiched among insulating oxide film 111, second base region 106 serving as a high-concentration p layer, and first base region center portion 103a, thereby decreasing an electric field concentrate on insulating oxide film 111. Hence, they may be separated by such a separation distance that the surface of the ion implantation layer serving as first base region center portion 103a is not bunched (the surface of the ion implantation layer is not exposed to the bottom of the trench). It should be noted that they should not be separated too much and may be separated by such a separation distance that the on resistance characteristic is avoided from being high due to the current path being long.

(Embodiment 1-2)

Figure 3:
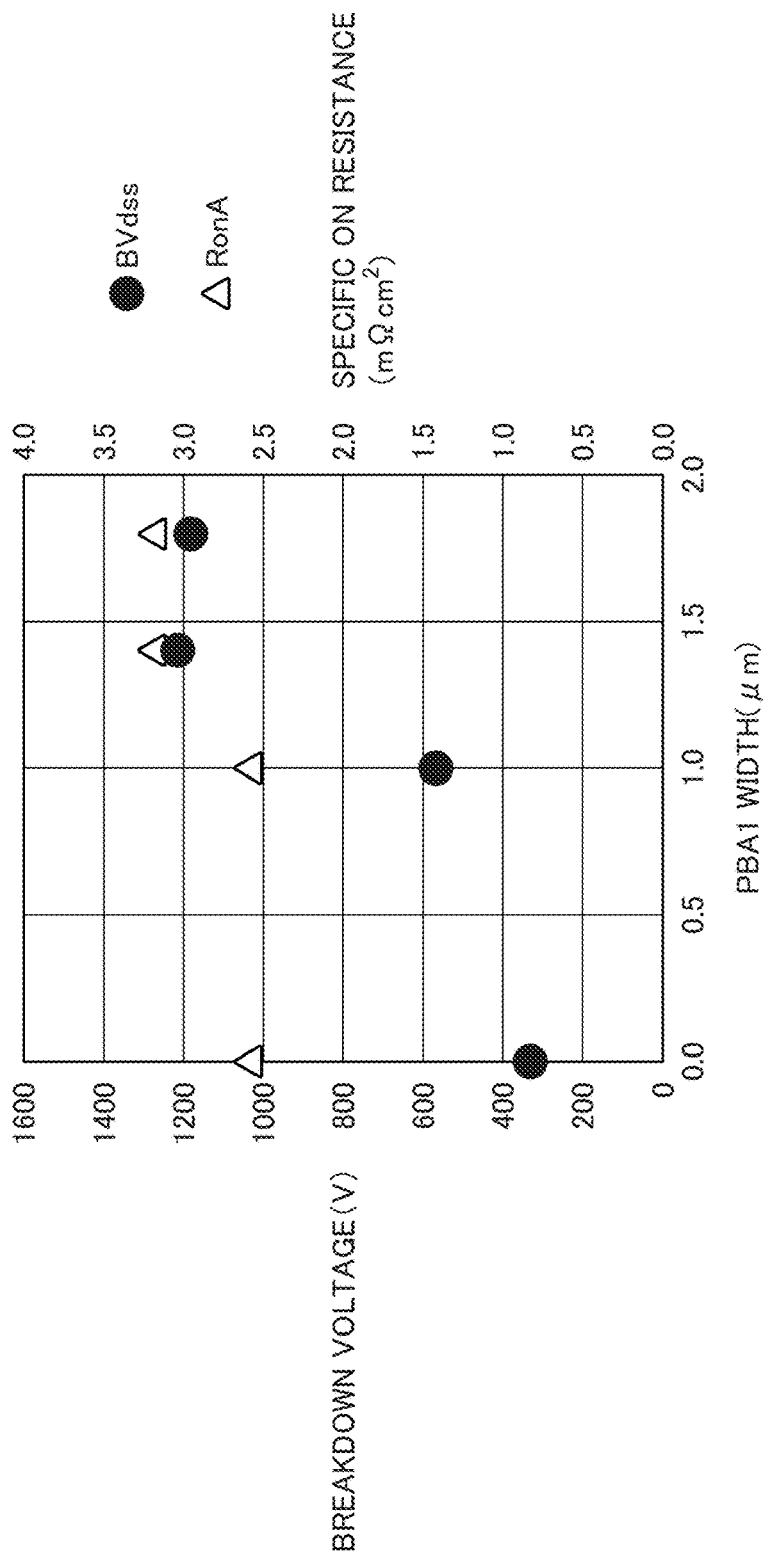
FIG. 3 shows dependency of on resistance and breakdown voltage on a width of the first base region.

FIG. 3 shows a relation of the breakdown voltage and specific on resistance with respect to the width of first base region center portion 103a located below the bottom of the trench of the SiC semiconductor device produced in embodiment 1-1. With the width of the bottom of trench 110 being fixed to 1 μm, MOSFETs were manufactured under the following four conditions: the width of first base region center portion 103a was 0 (no first base region center portion 103a was provided); the width of first base region center portion 103a was 1 μm (the same width as the bottom of trench 10), the width of first base region center portion 103a was 1.4 μm (each side with 0.2 μm; both sides with 0.4 μm); and the width of first base region center portion 103a was 1.8 μm (each side with 0.4 μm; both sides with 0.8 μm).

The manufactured MOSFETs including first base region center portions 103a having widths of 1.8 μm and 1.4 μm respectively had breakdown voltages of 1185 V and 1216 V. Hence, the designed breakdown voltage of 1200 V was substantially maintained. However, it was found that when the width of first base region center portion 103a was as large as the width of the bottom of the trench, i.e., when the width of first base region center portion 103a was 1.0 μm and when no first base region center portion 103a was provided (0 μm), the respective breakdown voltages were extremely decreased (deteriorated) to 570 V and 330 V, which were equal to or less than the half of the designed breakdown voltage.

On the other hand, when no first base region center portion 103a was provided (0 μm) and when the width (PBA1 width) of first base region center portion 103a was as large as the width of the trench, i.e., was 1.0 μm, each of the specific on resistances was decreased (improved) from 3.2 mΩ·cm² to 2.6 mΩ·cm².

Figure 4:
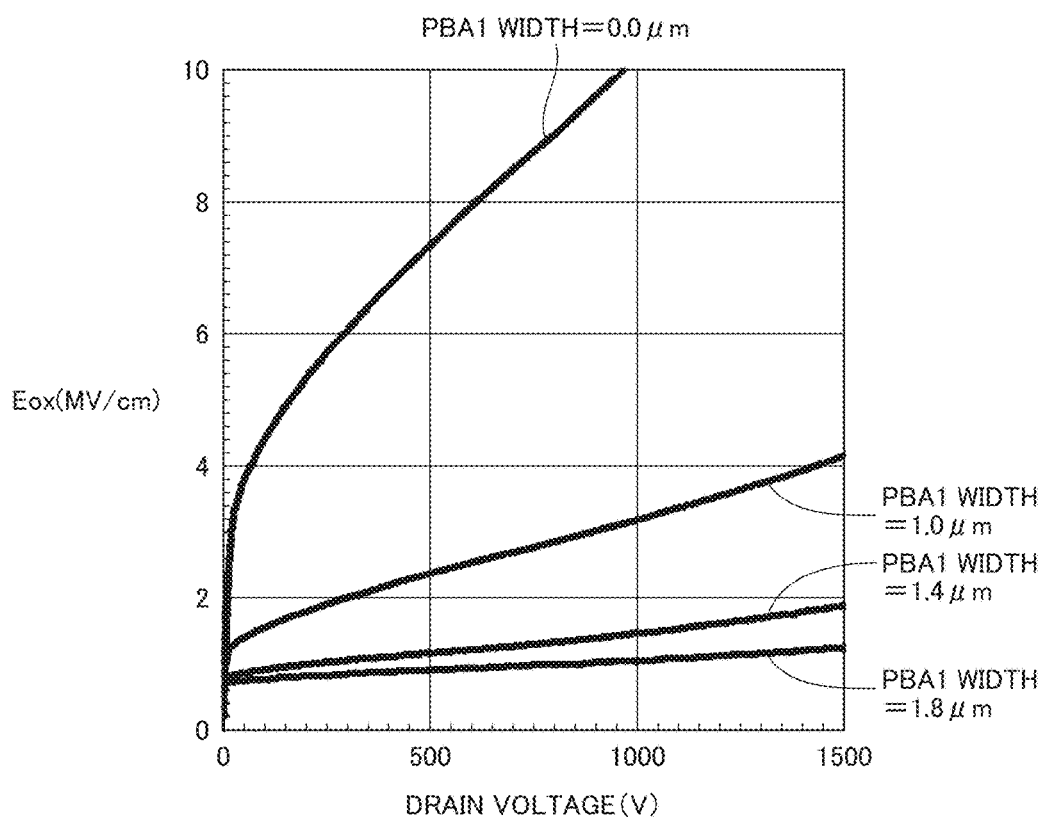
FIG. 4 shows dependency of the maximum electric field intensity (Eox) of an oxide film in a trench on drain voltage.

FIG. 4 shows dependency of a maximum electric field intensity (Eox) of the oxide film in the trench portion on drain voltage when width 121 (PBA1 width) of first base region center portion 103a is changed in the case where distance 122 (distance between PBA1s) between the center portion and first base region right side portion 103c or first base region left side portion 103b shown in FIG. 1A is 1.3 μm and the width of the trench is 1 μm. When the width of first base region center portion 103a is made larger than 1 μm, Eox can be decreased. In consideration of reliability of the oxide film, Eox needs to be equal to or less than 4 MV/cm, desirably, equal to or less than 2 MV/cm.

Figure 5:
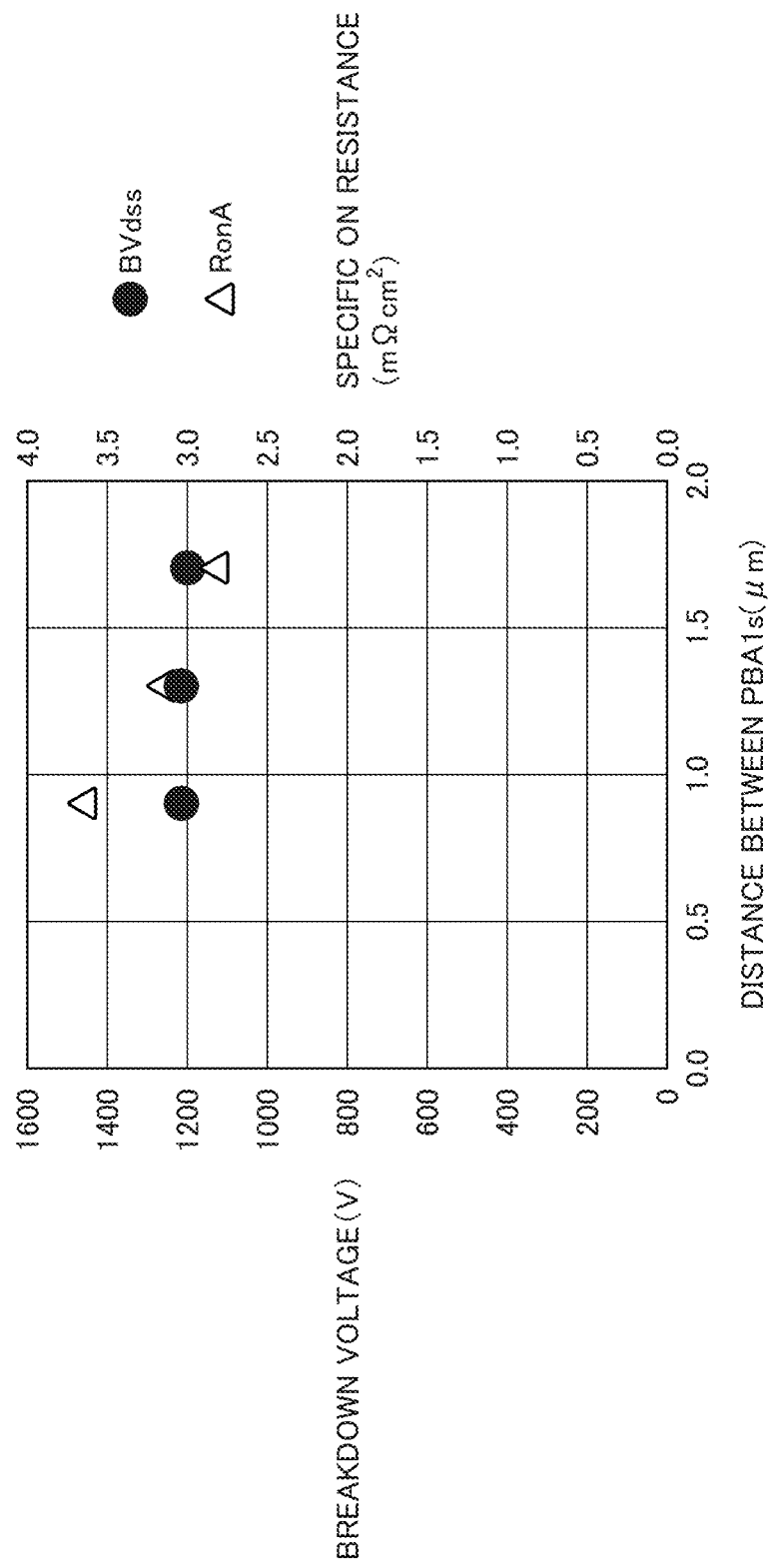
FIG. 5 shows dependency of the on resistance and breakdown voltage on a cell pitch.

FIG. 5 shows dependency of the specific on resistance (on resistance per unit area; hereinafter, simply referred to as on resistance) and the breakdown voltage on width 121 of first base region center portion 103a. When width 121 of first base region center portion 103a is as large as the width of the trench, electric field is concentrated on the lower portion of the trench to result in a decreased breakdown voltage. Hence, width 121 of first base region center portion 103a needs to be equal to or larger than the width of the trench.

Meanwhile, when separation distance 123 between first base region center portion 103a and the second base region in the horizontal direction was narrowed to 0.9 μm, the electric field did not reach the trench portion. Hence, the breakdown voltage could be maintained even when the width of first base region center portion 103a was narrowed to be the same as the width of the trench, i.e., 1 μm.

However, when separation distance 123 between first base region center portion 103a and the second base region in the horizontal direction is narrowed, the on resistance is increased, disadvantageously. Hence, in order to secure both the low on resistance and the breakdown voltage, the width of first base region center portion 103a needs to be equal to or larger than the width of the trench. Desirably, first base region center portion 103a needs to overhang relative to trench 110 by equal to or more than 0.1 μm in order to maintain breakdown voltage in consideration of variation.

On the other hand, the on resistance is not increased until width 121 of first base region center portion 103a is about 2 μm; however, when width 121 of first base region center portion 103a is increased more than that, a resistance component in lateral flow of current in trench current diffusion layer 105 cannot be ignored. That is, first base region center portion 103a desirably overhangs relative to the trench by equal to or less than 0.5 μm.

Therefore, in view of the above, the width of first base region center portion 103a is desirably wider than the width of the bottom of the trench by equal to or more than 0.2 μm and equal to or less than 2 μm, preferably, equal to or more than 0.1 μm and equal to or less than 0.5 μm.

FIG. 5 shows dependency of the on resistance characteristic and breakdown voltage characteristic on a cell pitch. Since the breakdown voltage can be maintained and the on resistance can be decreased even when the cell pitch is narrowed, it was found that each dependency shown in FIG. 4 and FIG. 5 can be maintained even when the cell pitch is narrowed.

(Embodiment 1-3)

In the same step as that in embodiment 1-1, review was made with regard to a relation between the on resistance and overlapping of first base region left side portion 103b or right side portion 103c with the end portion of second base region 106.

Figure 7:
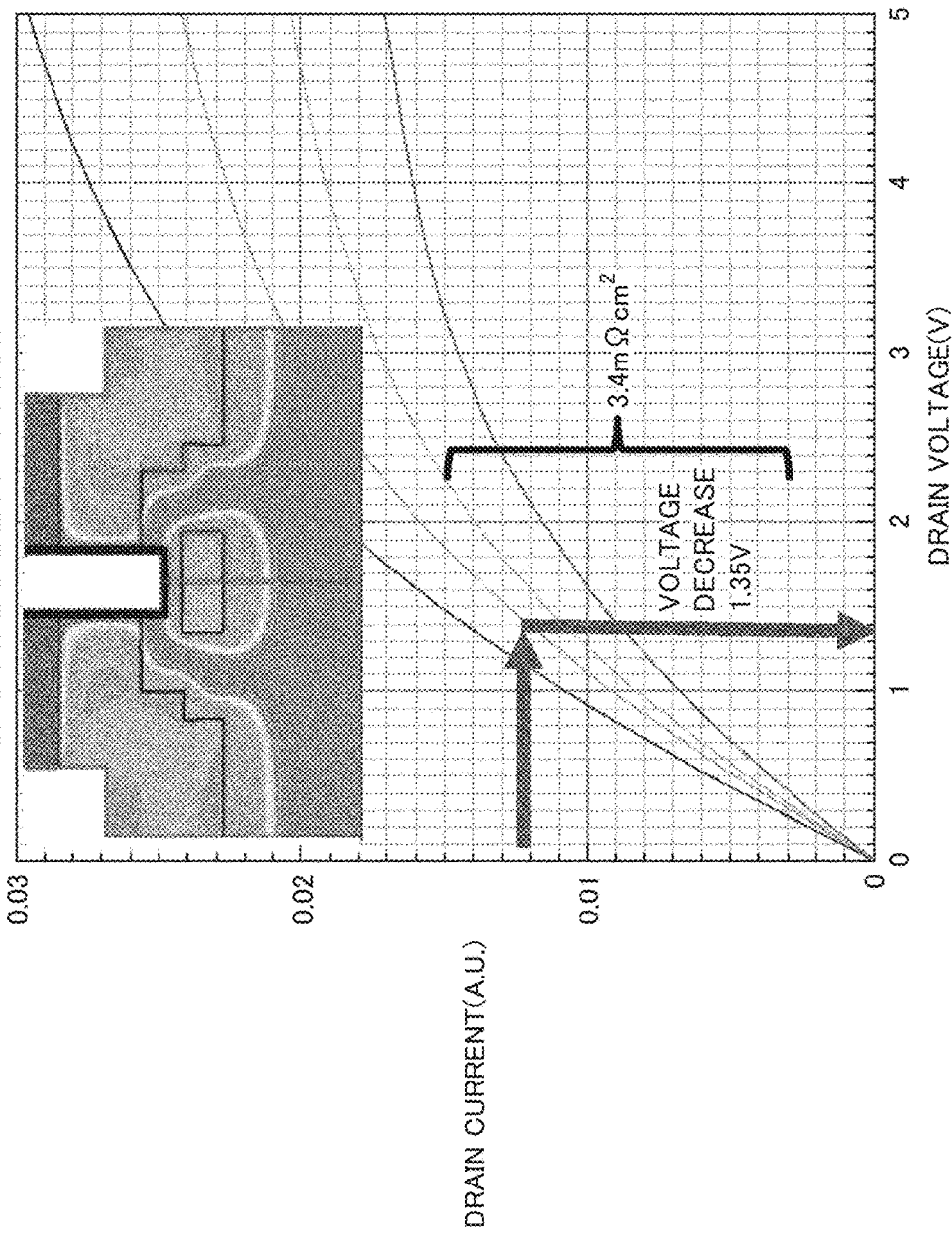
FIG. 7 shows a relation between drain current, diffusion of channel current, and drain voltage in a simulation when a first base region and a second base region provide a stepping structure.

FIG. 7 shows a relation between the drain current, diffusion of channel current, and the drain voltage in a simulation when first base region 103 and second base region 106 provide a stepping structure (stairway structure).

The distance between first base region center portion 103a and first base region left side portion 103b or right side portion 103c is made larger than the distance between first base region center portion 103a and the end portion of the second base region to expand a lying space therebetween and accordingly expand the current path, thereby reducing the on resistance to 3 mΩ·cm².

The step between first base region 103 and second base region 106 is desirably equal to or more than 0.2 μm and equal to or less than the thickness of first base region 103. When the step is smaller than 0.2 μm, there is no effect of diffusing the current. Also, when the step is larger than the thickness of first base region 103, the effect of the step in achieving the low on resistance is not obtained. Specifically, also when the step is larger than 0.6 μm, no effect is obtained.

(Embodiment 1-4)

Figure 6:
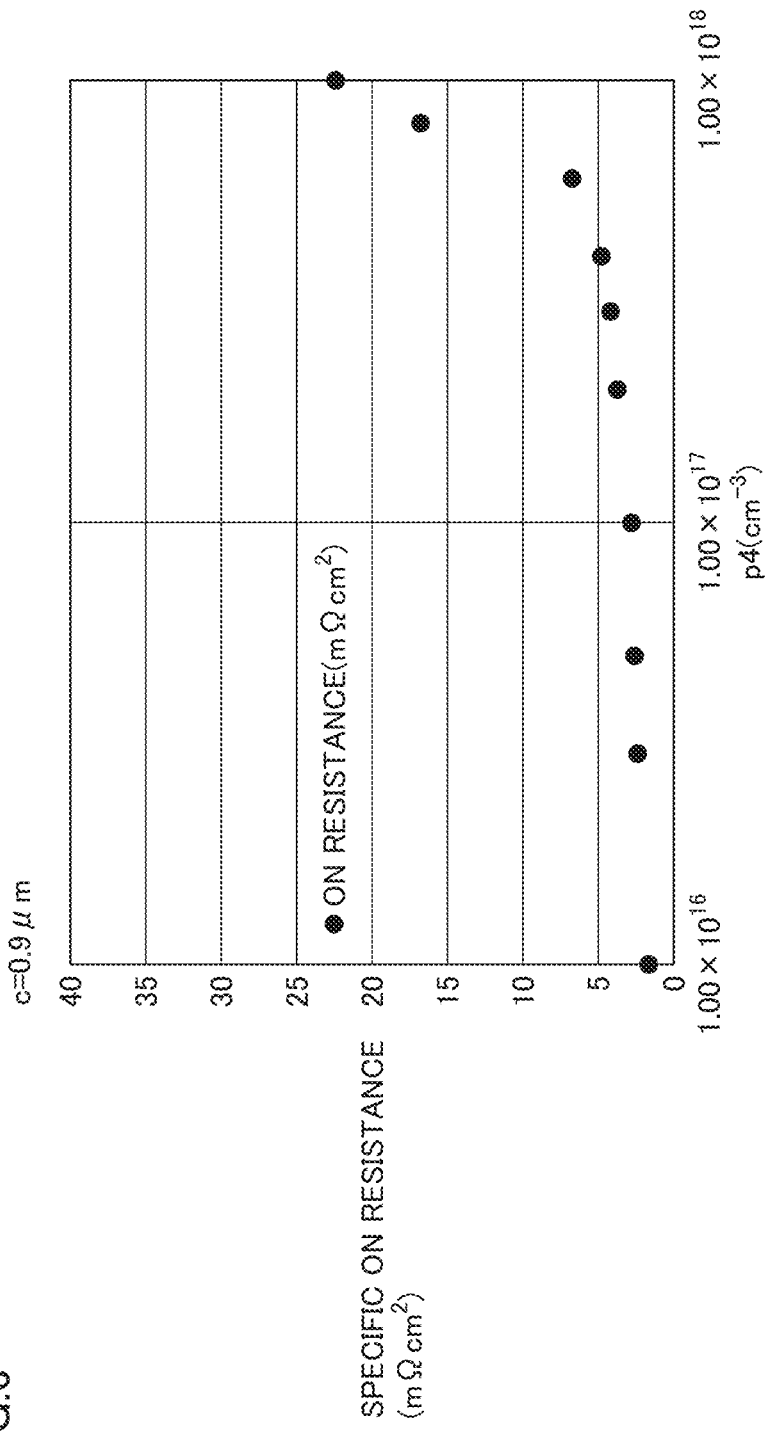
FIG. 6 shows dependency of the on resistance on a concentration of a p type epitaxial film constituting a body region 107.

FIG. 6 shows dependency of the on resistance characteristic on the concentration of the p type epitaxial film constituting body region 7 when separation distance 123 between the first base region center portion and the second base region in the horizontal direction satisfies c=0.9 μm.

It is understood that the low on resistance can be realized even with a high-concentration p layer by changing MOS interface conditions and the size of separation distance 123 between first base region center portion 103a and second base region 106 in the horizontal direction. The concentration of the p type epitaxial film is equal to or more than $1\times10^{16}$ cm$^{-3}$ and equal to or less than $3\times10^{17}$ cm$^{-3}$.

(Embodiment 1-5)

FIG. 1B shows a plane obtained by cutting first base region 103 in the semiconductor device of FIG. 2K in parallel with substrate 101 along an IB-IB line. Moreover, FIG. 1A shows a cross section obtained by cutting the semiconductor device of FIG. 2K perpendicularly to substrate 101 along an IA-IA line in FIG. 1B.

In FIG. 1B, trench 110 is disposed to overlap with first base region center portion 103a, and trench 110 extends in the long side direction of first base region center portion 103a. Moreover, first base region center portion 103a and first base region left side portion 103b are connected to each other by first base region connection portions 103d, and first base region center portion 103a and first base region right side portion 103c are connected to each other by first base region connection portions 103d. First base region connection portion 103d is produced at the same time during the production of first base region 103 in FIG. 2D with a predetermined mask (not shown) being provided on current diffusion layer 104.

The connection in first base region 103 is made to maintain the same potential among first base region center portion 103a, first base region left side portion 103b, and first base region right side portion 103c of the first base region. The connection in first base region 103 is made cyclically at the same grounding pitch in order to suppress variation in potential in a plane of the same chip.

Figure 8:
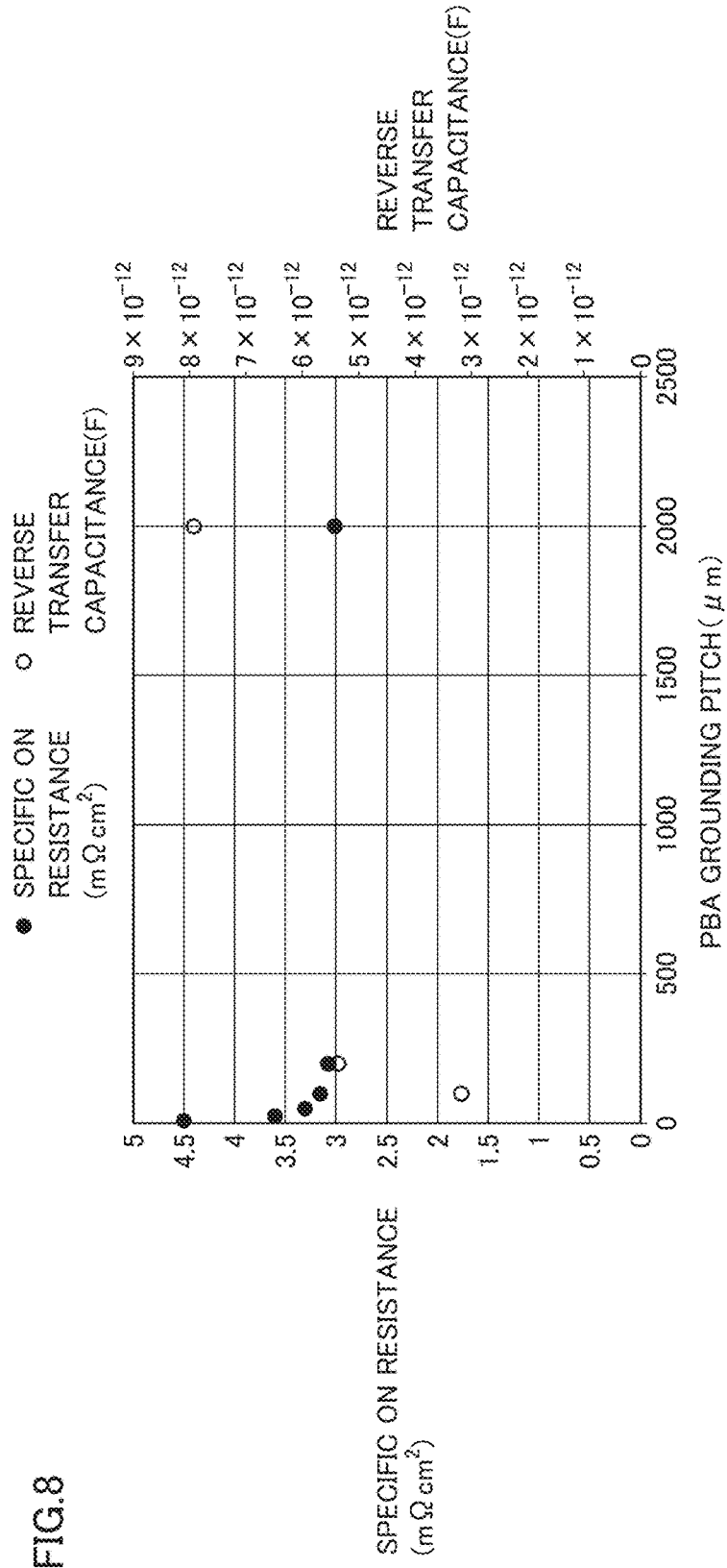
FIG. 8 shows a relation between a distance between first base region connection portions (inward direction) and each of specific on resistance and reverse transfer capacitance.

FIG. 8 shows a relation between the grounding pitch of first base region connection portions 103d and each of the specific on resistance and the reverse transfer capacitance (Crss). When grounding pitch 124 in first base region 103 is made shorter, current diffusion layer 104 becomes smaller by first base region connection portion 103d, with the result that the on resistance is increased. On the other hand, when grounding pitch 124 in first base region 103 is made longer, connection portion 103d becomes smaller, with the result that the reverse transfer capacitance becomes large in a high-speed operation of the semiconductor device because first base region center portion 103a directly below the trench is insufficiently grounded. Accordingly, the high-speed operation cannot be performed due to oscillation or the like. Therefore, from FIG. 8, it is understood that the grounding pitch is preferably equal to or more than 10 μm and equal to or less than 200 μm.

<Second Embodiment>

In the present disclosure, in the p− layer provided at the outer circumference of the semiconductor and serving as an outermost surface, a p+ region having a high impurity concentration is embedded, thereby producing a termination structure. Therefore, the present disclosure can be applied to any type of semiconductor as long as the p− layer serving as the outermost surface is produced in the semiconductor device manufacturing step.

Particularly, the present disclosure is suitable for an invention of an outer circumferential termination structure of a vertical type SiC semiconductor device disclosed and shown in FIG. 6 of Japanese Patent Application No. 2014-134898 filed by the inventor. This is due to the following reason: since second base region 106 constituted of a p− epitaxial film is formed on trench current diffusion layer 105 constituted of an n− epitaxial film and formed on the drift layer in FIG. 6, the outer circumferential structure thereof can be used for formation of an outer circumferential termination structure of the present disclosure without modification.

(Embodiment 2-1)

The following describes the simplest configuration of the present disclosure, i.e., an outer circumferential termination structure in which a p+ region having a high impurity concentration is embedded in a p− layer located at the outer circumference of the semiconductor and serving as an outermost surface. For the sake of comparison, FIG. 9A shows a schematic view of an outer circumferential termination structure of a conventional structure, whereas each of FIG. 9B and FIG. 9C shows a schematic view of an outer circumferential termination structure of the present disclosure.

The following describes an overview of production of the conventional outer circumferential termination structure shown in FIG. 9A. The silicon carbide single crystal substrate is composed of a hexagonal silicon carbide single crystal with polytype 4H, for example. The silicon carbide substrate has a maximum diameter of 75 mmφ, preferably, equal to or more than 100 mmφ, for example. The silicon carbide substrate has a {0001} plane or a plane angled off by 8° or less relative to the {0001} plane, for example. The silicon carbide single crystal substrate has a thickness of 400 μm, and has a resistivity of 0.017 Ωcm, for example.

Next, an CVD device is employed to form an epitaxial layer on the silicon carbide single crystal substrate using silane and propane for a source material, nitrogen for dopant gas, and hydrogen for carrier gas such that the epitaxial layer has a donor concentration of $8 \times 10^{15}$ cm$^{-3}$ and has a thickness of 10 µm. The epitaxial layer serves as a drift layer for an element having a breakdown voltage of 1200 V.

On the epitaxial layer, a termination breakdown voltage structure is formed through ion implantation. Active portion boundary regions, i.e., a high-concentration layer 201 and a high-concentration layer 202 are formed through aluminum ion implantation using a resist mask (not shown) to surround an active portion serving to perform a transistor operation. The concentration thereof is $8 \times 10^{19}$ cm$^{-3}$.

Further, regions of a first electric field relaxing layer 204 and a second electric field relaxing layer 205 are formed simultaneously using a resist mask (not shown) through ion implantation with $3 \times 10^7$ cm$^{-3}$ of aluminum. Only into the region of first electric field relaxing layer 204, $3 \times 10^{17}$ cm$^{-3}$ of aluminum is additionally implanted using an ion implantation mask (not shown). Accordingly, a density difference is formed.

For the ion implantations into first electric field relaxing layer 204 and second electric field relaxing layer 205, the ion implantations are performed to overlap with a portion of high-concentration layer 201, thereby avoiding formation of a low-concentration region between the respective regions. Each of the widths of first electric field relaxing layer 204 and second electric field relaxing layer 205 is 40 µm and each of the depths of first electric field relaxing layer 204 and second electric field relaxing layer 205 is 0.7 µm.

Finally, phosphorus is implanted into the outermost circumferential end portion at a donor concentration of $5 \times 10^{19}$ cm$^{-3}$, thereby producing a channel stop layer 206. Then, activation annealing is performed at 1700° C. for 20 minutes, thereby forming the conventional outer circumferential termination structure. Channel stop layer 206 may be appropriately selected to have a donor concentration falling within a range of equal to or more than $1 \times 10^{18}$ cm$^{-3}$ and equal to or less than $1 \times 10^{21}$ cm$^{-3}$.

Next, the following describes an overview of production of the outer circumferential termination structure of the present disclosure shown in FIG. 9B with reference to the conventional example. The description below is mainly directed to a difference therebetween. In the present disclosure, a p− electric field diffusion layer 207 is formed in addition to first electric field relaxing layer 204 and second electric field relaxing layer 205. A pn diode formed between p− electric field diffusion layer 207 and drift layer 203 can relax electric field at the termination portion.

First, using silane and propane for a source material, gasified trimethylaluminum for dopant gas, and hydrogen for carrier gas, a CVD device is employed to form a p− epitaxial layer (not shown) on drift layer 203, which is formed on substrate 101 shown in the conventional example, at a region to subsequently serve as high-concentration layer 201, first electric field relaxing layer 204, second electric field relaxing layer 205 and p− electric field diffusion layer 207 such that the p− epitaxial layer has an acceptor concentration of $5 \times 10^{15}$ cm$^{-3}$ and a thickness of 0.5 µm. Because the concentration of the p− electric field diffusion layer 207 will remain unchanged, the acceptor concentration is selected appropriately in the range of equal to or more than $3 \times 10^{15}$ cm$^{-3}$ to equal to or less than $3 \times 10^{17}$ cm$^{-3}$.

The termination breakdown voltage structure of the present disclosure is formed thereon through ion implantation. First, the active portion boundary regions, i.e., high-concentration layer 201 and high-concentration layer 202 are formed by aluminum ion implantation using a resist mask (not shown) to surround an active portion serving to perform a transistor operation. The concentration thereof is $8 \times 10^{19}$ cm$^{-3}$.

Thereafter, by the same production method as the production method of FIG. 9A of the conventional example, first electric field relaxing layer 204 and second electric field relaxing layer 205 in FIG. 9B showing the novel structure are produced. A remaining region of the p− epitaxial layer after producing first electric field relaxing layer 204 and second electric field relaxing layer 205 serves as p− electric field diffusion layer 207.

For the ion implantations into the regions of first electric field relaxing layer 204 and second electric field relaxing layer 205, as with the conventional example, the ion implantations are performed to overlap with a portion of high-concentration layer 201, thereby avoiding formation of a low-concentration region between the respective regions. Each of the widths of first electric field relaxing layer 204, second electric field relaxing layer 205, and p− electric field diffusion layer 207 is 40 µm, and each of the depths of first electric field relaxing layer 204, second electric field relaxing layer 205, and p− electric field diffusion layer 207 is 0.7 µm.

Finally, phosphorus is implanted into the outermost circumferential end portion at a donor concentration of $5 \times 10^{19}$ cm$^{-3}$, thereby forming a channel stop layer 206. Further, activation annealing is performed at 1700° C. for 20 minutes, thereby forming the outer circumferential termination structure of the present disclosure. In the manner described above, the outer circumferential termination structure of the semiconductor device is manufactured.

The outer circumferential termination structure of the semiconductor device has the electric field relaxing layer for maintaining breakdown voltage, at the outer circumferential portion of the surface of the semiconductor device. Drift layer 203 is constituted of a first conductivity type thin film. A second conductivity type thin film is formed on the first conductivity type thin film. The second conductivity type thin film has high-concentration layer 201, first electric field relaxing layer 204, second electric field relaxing layer 205, and electric field diffusion layer 207, which are continuous to one another and have different concentrations such that the concentrations are lower toward the outer circumference of the semiconductor device. In other words, the second conductivity type thin film includes: a high-concentration layer having a first impurity concentration; a first electric field relaxing layer continuous to the high-concentration layer at the outer circumference of the high-concentration layer, the first electric field relaxing layer having a second impurity concentration lower than the first impurity concentration; a second electric field relaxing layer continuous to the first electric field relaxing layer at the outer circumference of the first electric field relaxing layer, the second electric field relaxing layer having a third impurity concentration lower than the second impurity concentration; and a first electric field diffusion layer continuous to the second electric field relaxing layer at the outer circumference of the second electric field relaxing layer, the first electric field diffusion layer having a fourth impurity concentration lower than the third impurity concentration. Channel stop layer 206 is located at the ultimate end of the outer circumferential portion of the surface, is connected to electric field diffusion layer 207, has an impurity concentration higher than that of drift layer 203, and has the first conductivity type. Three or more electric field relaxing layers may be provided.

In comparison of the novel structure produced as described above with the conventional structure, the p+ layer is formed in the relatively p– layer in the novel structure, so that a boundary between first electric field relaxing layer 204 and second electric field relaxing layer 205 is not a pn junction but a High-Low junction, which is a junction between a high-concentration p layer and a low-concentration p layer.

Therefore, no built-in potential occurs between high-concentration layer 201 and channel stop layer 206, with the result that electric field distribution becomes gradual and no electric field concentrate occurs. The conventional outer circumferential termination structure produced on the drift layer for an element having a breakdown voltage of 1200 V has a maximum breakdown voltage of 1350 V, whereas the novel outer circumferential termination structure has a maximum breakdown voltage of 1440 V.

Moreover, as a modification of embodiment 2-1, as shown in FIG. 9C, an n electric field diffusion layer 210 may be provided between drift layer 203 and the p– epitaxial layer (not shown). In other words, between drift layer 203 and the second conductivity type thin film, there may be first conductivity type electric field diffusion layer 210 (second electric field diffusion layer) constituted of the first conductivity type thin film having an impurity concentration higher than that of drift layer 203. The second conductivity type thin film and first conductivity type electric-field diffusion layer 210 may be produced by one of the epitaxial growth method and the ion implantation. With the above structure, the electric field concentrate is further relaxed and the breakdown voltage of the element can be improved.

(Embodiment 2-2)

Figure 10A:
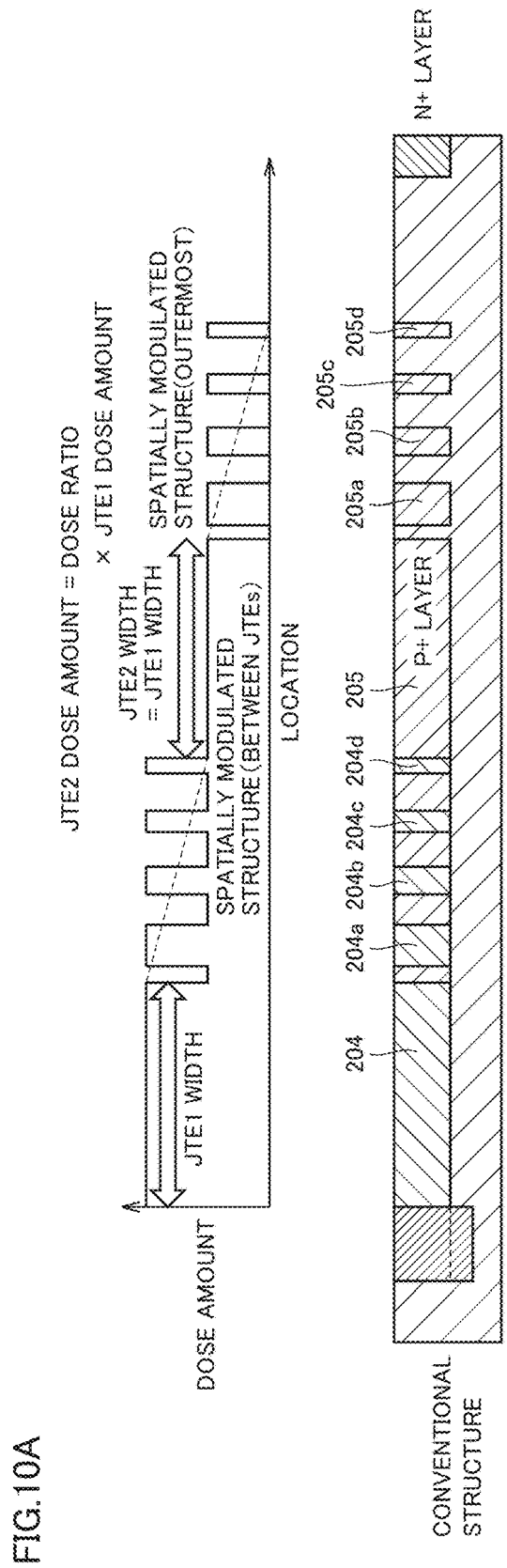
FIG. 10A shows a semiconductor outer circumferential structure in a conventional structure.
Figure 10B:
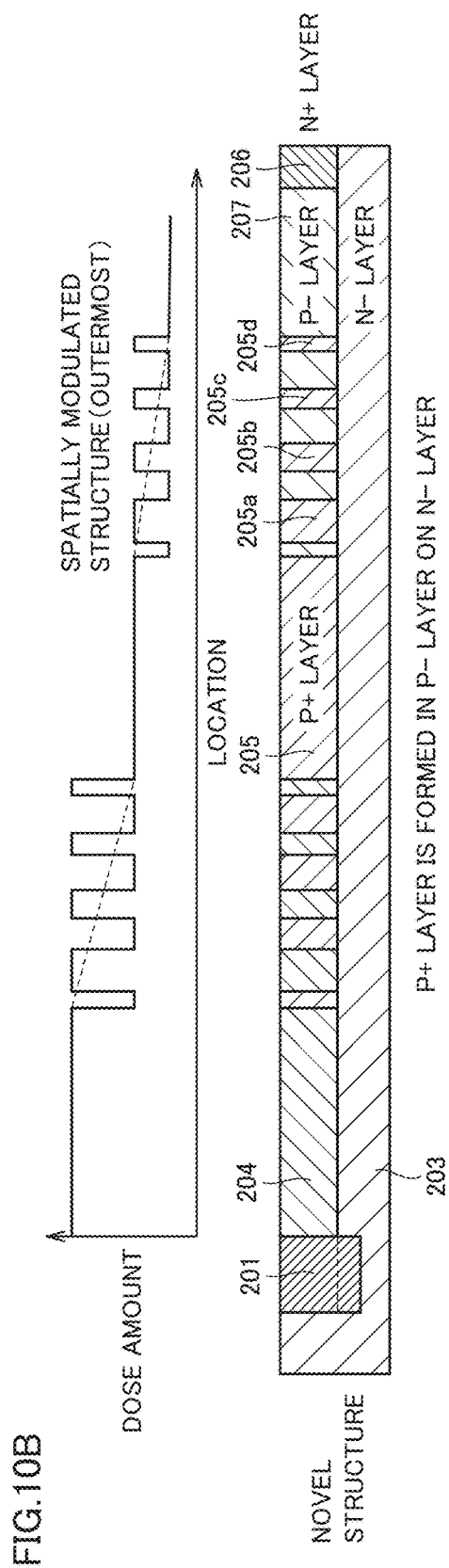
FIG. 10B shows a semiconductor outer circumferential structure of an embodiment 2-2 of the present disclosure.

Next, the following describes an embodiment 2-2 of the present disclosure in which spatial modulation is applied for the purpose of relaxation of electric field concentrate in the basic outer circumferential termination structure of the present disclosure produced in embodiment 2-1, with reference to FIG. 10B and with reference to FIG. 9B showing embodiment 2-1 as required.

In the present disclosure, using silane and propane for a source material, nitrogen for dopant gas, and hydrogen for carrier gas, a CVD device is employed to form an epitaxial layer on the silicon carbide substrate to have a donor concentration of $3\times10^{15}$ cm$^{-3}$ and have a thickness of 30 µm, which is increased from the thickness of 10 µm in embodiment 1-1. As the epitaxial layer, a drift layer for an element having a breakdown voltage of 3300 V is used.

In the disclosure of a conventional structure shown in FIG. 10A, in order to further suppress an electric field concentrate in the outer circumferential termination portion, spatially modulated first electric field relaxing layers 204a, 204b, 204c, 204d are provided near both sides of the boundary between first electric field relaxing layer 204 and second electric field relaxing layer 205, and spatially modulated second electric field relaxing layers 205a, 205b, 205c, 205d are formed outwardly of second electric field relaxing layer 205.

Respective widths of first electric field relaxing layers 204a, 204b 204c, 204d are 12 µm, 9 µm, 6 µm, and 3 µm, for example. Respective intervals between first electric field relaxing layers 204a, 204b 204c, 204d are 3 µm, 6 µm, 9 µm, and 12 µm. By changing the intervals continuously in this way, electric field could be avoided from being concentrated on the boundary between the region of first electric field relaxing layer 204 and the region of second electric field relaxing layer 205 and on the boundary between second electric field relaxing layer 205 and p– electric field diffusion layer 207 as shown in FIG. 10B.

These conventional spatially modulated first electric field relaxing layers 204a to 204d and second electric field relaxing layers 205a to 205d can be produced by spatially modulating the resist masks (not shown) used to produce first electric field relaxing layer 204 and second electric field relaxing layer 205 in the conventional example compared with embodiment 2-1.

In order to produce the outer circumferential termination structure according to embodiment 2-2, first, using silane and propane for a source material, gasified trimethylaluminum for dopant gas, and hydrogen for carrier gas, a CVD is employed to form a 0.5-µm p– epitaxial layer on drift layer 203, formed on substrate 101, for an element having a breakdown voltage of 3300 V such that the p– epitaxial layer has an acceptor concentration of $5\times10^{15}$ cm$^{-3}$.

The termination breakdown voltage structure is formed thereon through ion implantation. First, the active portion boundary regions, i.e., high-concentration layer 201 and high-concentration layer 202 are formed at a concentration of $8\times10^{19}$ cm$^{-3}$ by aluminum ion implantation using a resist mask (not shown) to surround an active portion serving to perform a transistor operation.

Thereafter, by the same production method as the production method for the conventional structure in FIG. 10A, the novel structure in FIG. 10B may be produced.

Each of first electric field relaxing layer 204 and second electric field relaxing layer 205 may further include an embedded structure spatially modulated to gradually cease to exist toward the outer circumference in the electric field relaxing layer or electric field diffusion layer 207 at least circumferentially outwardly adjacent to first electric field relaxing layer 204 or second electric field relaxing layer 205. That is, the semiconductor device may further include a plurality of embedded regions 205a to 205d located in first electric field diffusion layer 207. The respective widths of the plurality of embedded regions become smaller toward the outer circumference of the semiconductor device. Each of the plurality of embedded regions has the second conductivity type. An interval between two adjacent ones of the plurality of embedded regions may become larger toward the outer circumference of the semiconductor device.

Figure 12A:
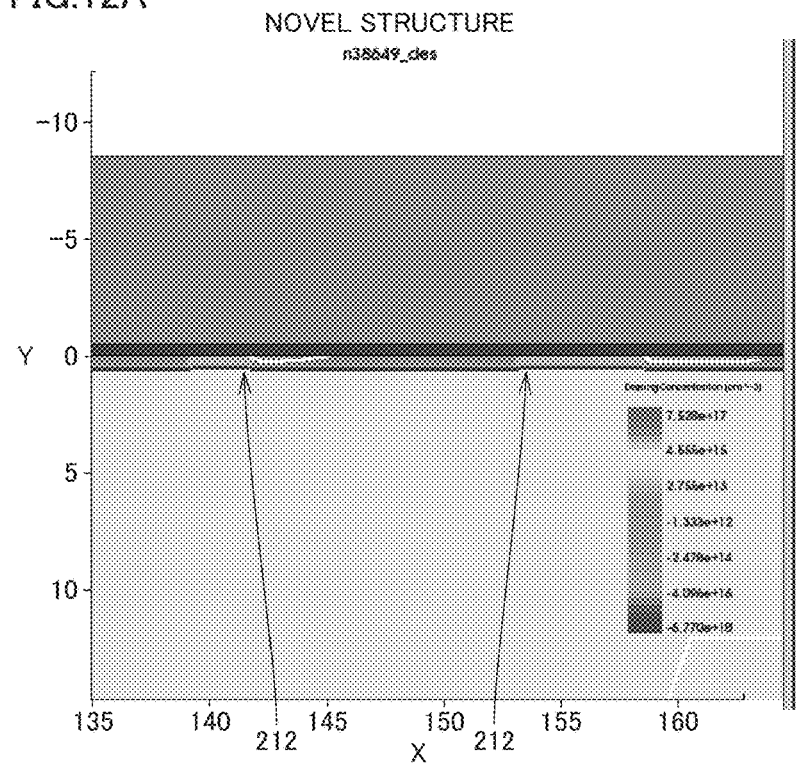
FIG. 12A shows an impurity concentration in the semiconductor outer circumferential structure of the present disclosure.
Figure 12B:
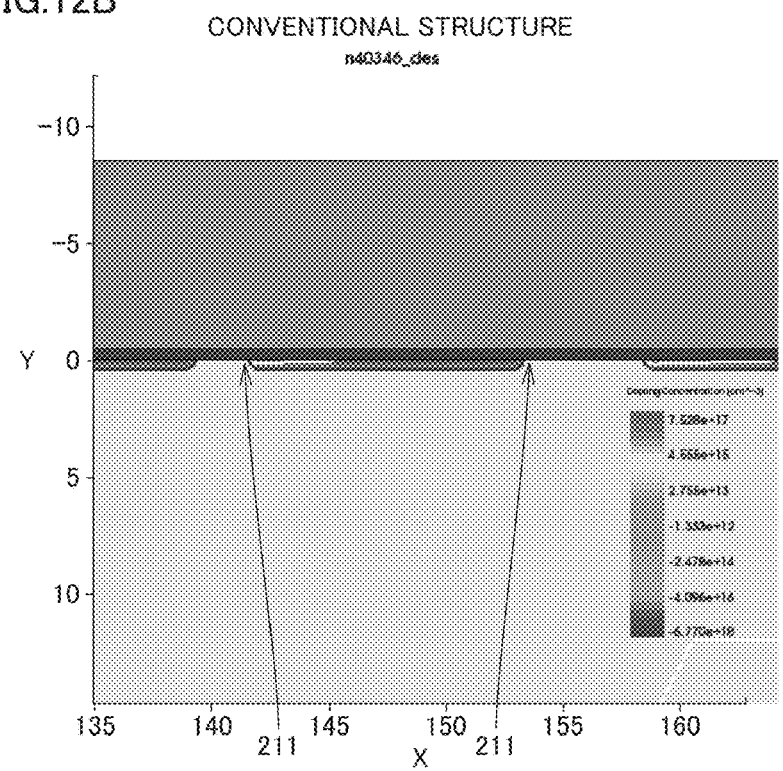
FIG. 12B shows an impurity concentration in the semiconductor outer circumferential structure of the conventional example.

FIG. 12A and FIG. 12B respectively show concentration distributions in the novel structure (FIG. 10B) and the conventional structure (FIG. 10A). In the conventional structure, boundary portion 211 is constructed due to the p+ layer being formed in the n– drift layer. On the other hand, in the novel structure, boundary portion 212 is constructed due to the p+ layer being formed in the relatively p– layer. Accordingly, it is understood that the boundary is not a pn junction but a High-Low junction, which is a junction between a high-concentration p layer and a low-concentration p layer.

Accordingly, no built-in potential occurs and an electric field distribution therefore becomes gradual, thus resulting in no electric field concentrate. This will be described below.

Figure 13A:
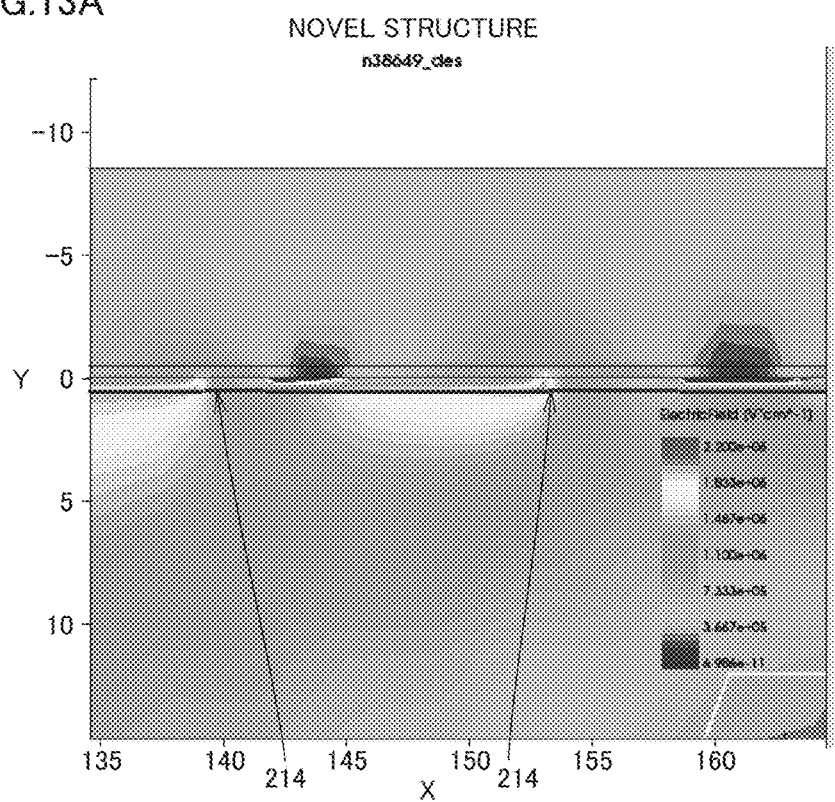
FIG. 13A shows an electric field concentrate in the semiconductor outer circumferential structure of the present disclosure.
Figure 13B:
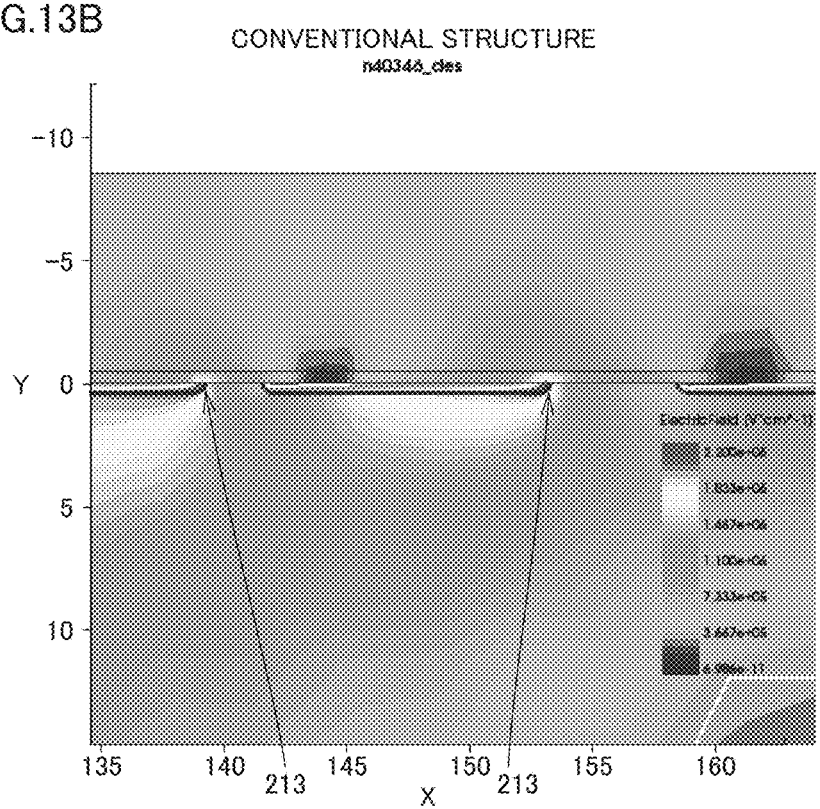
FIG. 13B shows an electric field concentrate in the semiconductor outer circumferential structure of the conventional example.

FIG. 13A and FIG. 13B respectively show electric field distributions in the novel structure (FIG. 10B) and the conventional structure (FIG. 10A). Respective concentrations represent respective electric field intensities.

With reference to FIG. 13A and FIG. 13B, it is understood that an electric field concentrate is suppressed in boundary portion 214 in the novel structure (FIG. 10B) as compared with boundary portion 213 on which electric field is concentrated in the conventional structure (FIG. 10A), the breakdown voltage is maintained by the whole of the bottom portion of the p layer, and dielectric breakdown at an end portion can be suppressed.

The maximum breakdown voltage was 3600 V in the conventional structure produced on the drift layer for an element having a breakdown voltage of 3300 V, whereas the maximum breakdown voltage was 4050 V in the novel structure.

(Embodiment 2-3)

When n electric field diffusion layer 210 is provided between drift layer 203 and the p– epitaxial layer (not shown) as shown in the modification (FIG. 9C) of embodiment 2-1, the electric field concentrate is further relaxed and the breakdown voltage of the element can be improved.

Figure 11A:
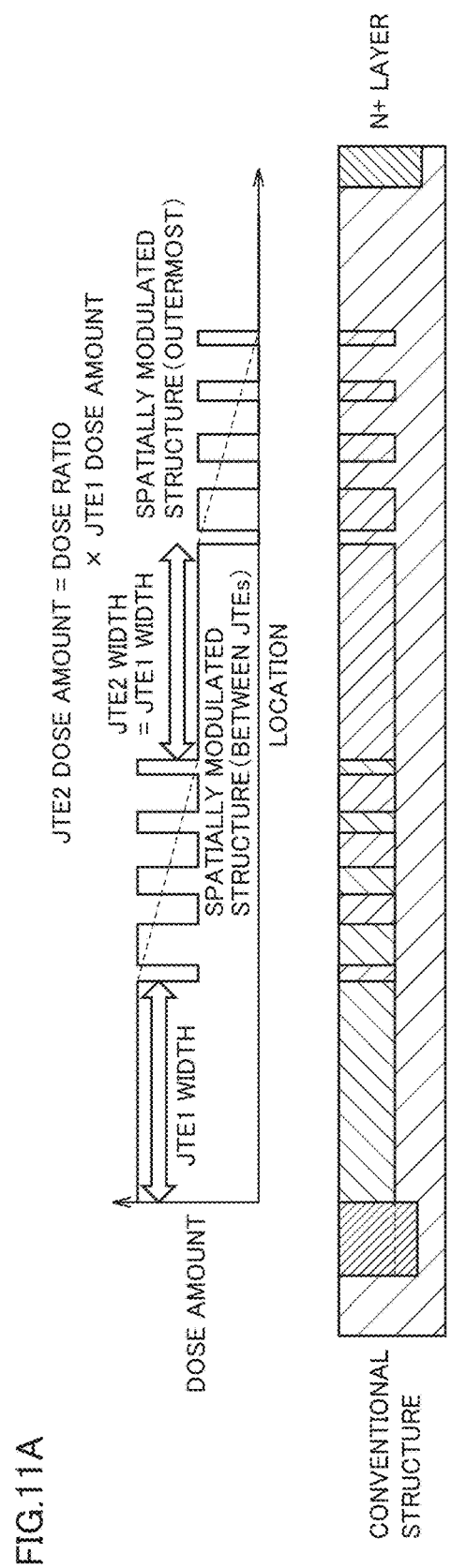
FIG. 11A shows a semiconductor outer circumferential structure in a conventional structure.
Figure 11B:
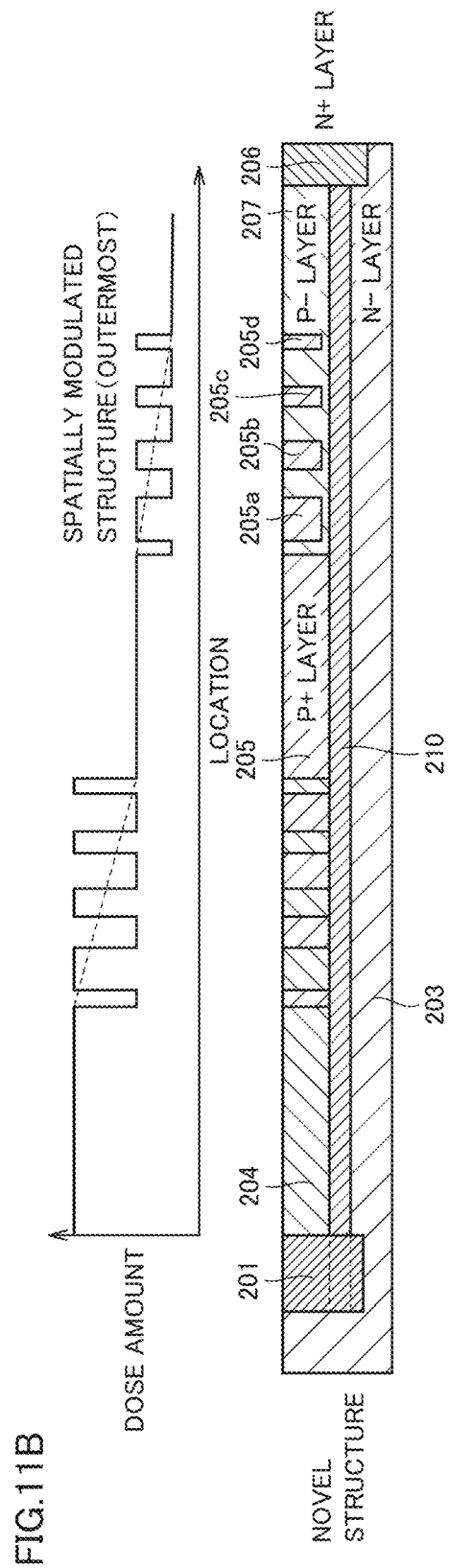
FIG. 11B shows a semiconductor outer circumferential structure of an embodiment 2-3 of the present disclosure.

With reference to FIG. 11B, the following describes an embodiment 2-3 in which embodiment 2-2 is applied to the modification of embodiment 2-1. The description below is mainly directed to a difference therebetween.

As with embodiment 2-2, using silane and propane for a source material, nitrogen for dopant gas, and hydrogen for carrier gas, a CVD device is employed to form an epitaxial layer on a silicon carbide substrate to have a donor concentration of $3 \times 10^{15}$ cm$^{-3}$ and a thickness of 30 μm. The epitaxial layer is a drift layer for an element having a breakdown voltage of 3300 V.

After an ion implantation step of producing the transistor portion, an epitaxial layer having a donor concentration of $5 \times 10^{16}$ cm$^{-3}$ and a thickness of 0.5 μm is formed using the same CVD device as required, thereby producing n electric field diffusion layer 210.

Then, using silane and propane for a source material, gasified trimethylaluminum for dopant gas, and hydrogen for carrier gas, a CVD device is employed to form thereon a p– epitaxial layer (not shown) having an acceptor concentration of $1 \times 10^{17}$ cm$^{-3}$ and a thickness of 1.6 μm.

Further, using a resist mask (not shown), the regions of first electric field relaxing layer 204 and second electric field relaxing layer 205 (inclusive of second electric field relaxing layers 205a, 205b, 205c, 205d) are formed through ion implantation of $4 \times 10^{17}$ cm$^{-3}$ of aluminum. Moreover, $4 \times 10^{17}$ cm$^{-3}$ of aluminum is additionally implanted only into the region of first electric field relaxing layer 204 (inclusive of first electric field relaxing layers 204a, 204b, 204c, 204d) using an ion implantation mask (not shown). In this way, a density difference is formed. The ion implantations are performed to overlap with a portion of high-concentration layer 201, thereby avoiding formation of a low-concentration region between the respective regions. Each of the widths of first electric field relaxing layer 204 and second electric field relaxing layer 205 is 40 μm and each of the depths of first electric field relaxing layer 204 and second electric field relaxing layer 205 is 0.7 μm.

Finally, phosphorus is implanted into the outermost circumferential end portion at a donor concentration of $5 \times 10^{19}$ cm$^{-3}$ to produce channel stop layer 206, and activation annealing is performed at 1700° C. for 20 minutes, thus completing the novel structure shown in FIG. 11B. The maximum breakdown voltage was 3600 V in the conventional structure in FIG. 11A (the same as FIG. 10A), whereas the maximum breakdown voltage was 4150 V in the novel structure. Each of the plurality of embedded regions 205a to 205d is disposed inside first electric field diffusion layer 207. Each of the plurality of embedded regions 205a to 205d may be separated from n electric field diffusion layer 210.

(Embodiment 2-4)

The above-described specific effect of the present disclosure, i.e., no occurrence of electric field concentrate at the end portion of the outer circumferential termination structure, can be applied to an ordinary planar type or vertical type transistor or diode, and is particularly suitable for a transistor provided with a trench structure. This is because the p layer or the n layer and the p layer, which are formed on the drift layer required for the transistor having the trench structure, can be used without modification and no new additional steps are required.

Each of FIG. 1A and FIG. 2K shows a cross sectional view of the vertical type SiC semiconductor device of the present disclosure.

In the vertical type SiC semiconductor device of FIG. 1A and FIG. 2K, low-concentration n– trench current diffusion layer 105 constituted of the epitaxial thin film is further formed on n– drift layer 102. Next, body region 107 constituted of the p– epitaxial thin film is formed.

Hence, when drift layer 102 of FIG. 1A is constructed as drift layer 203 of the present disclosure, trench current diffusion layer 105 of FIG. 1A is constructed as n electric field diffusion layer 210 of the present disclosure, and body region 107 of FIG. 1A is constructed as the p– epitaxial layer (not shown) of the present disclosure, embodiment 2-3 (FIG. 11B) is implemented without two additional steps, i.e., the production of n electric field diffusion layer 210 of the present disclosure and the production of the p– epitaxial layer of the present disclosure.

Moreover, in the case of a transistor provided with a trench structure having no trench current diffusion layer 105, the structure shown in embodiment 2-1 (FIG. 9B) or embodiment 2-2 (FIG. 10B) of the present disclosure is produced in which body region 107 of FIG. 1A is constructed as the p– epitaxial layer of the present disclosure and no n electric field diffusion layer 210 is provided.

The semiconductor device may be a SiC semiconductor element provided with a trench. The first conductivity type thin film constituting the drift layer may be a first conductivity type thin film constituting the drift layer of the SiC semiconductor element. In other words, the first conductivity type thin film includes the drift region of the silicon carbide semiconductor element. The second conductivity type thin film may be a second conductivity type thin film constituting the body region of the SiC semiconductor element. The second conductivity type thin film may include the body region of the silicon carbide semiconductor element. The high-concentration thin film constituting the first conductivity type electric field diffusion layer may be a first conductivity type low-concentration thin film constituting the trench current diffusion layer of the SiC semiconductor element. In other words, the first conductivity type electric field diffusion layer (second electric field diffusion layer) may include a trench current diffusion layer of the silicon carbide semiconductor element.

The present disclosure is directed to a structure in which no electric field concentrate occurs at the end portion of the outer circumferential termination structure of the semiconductor element, can be applied to an ordinary planar type or vertical type transistor or diode, is particularly suitable for a transistor provided with a trench structure, and can be used to shorten the manufacturing process.

<Third Embodiment>

A feature of a method for manufacturing the semiconductor device according to the present disclosure lies in that: a trench portion is formed and processed while suppressing a sub trench in a wafer composed of SiC; and hydrogen annealing is performed in a quasi-thermal equilibrium state in order to remove a damage portion in a side wall of the trench portion.

By performing the hydrogen annealing onto the trench portion in the quasi-thermal equilibrium state under presence of a solid SiC source, the side wall and bottom portion of the trench of the wafer composed of SiC can be smoothed and avoided from being rough, and a trench shoulder portion can be rounded at the same time.

By smoothing the side wall and bottom portion of the trench in this way, TDDB (Time Dependent Dielectric Breakdown) is not deteriorated in the element, thus improving reliability.

Moreover, the rounded trench shoulder leads to improved coverage of the gate oxide film or gate electrode, thus suppressing an electric field concentrate and reducing leakage current.

(Embodiment 3-1)

FIG. 1A shows an exemplary vertical type silicon carbide semiconductor device provided with a trench.

In vertical type silicon carbide semiconductor device 100 provided with the trench, the width of the trench is equal to or more than 0.2 μm and equal to or less than 0.6 μm. The curvature radius of an upper corner of the trench is equal to or more than 0.1 μm. The width of the trench may be equal to or more than 0.5 μm. The curvature radius of the upper corner of the trench may be equal to or more than 0.1 μm. The width of the trench may be equal to or more than 0.2 μm and equal to or less than 0.6 μm. Preferably, there is no damage in the wall surface of the trench.

Each of FIG. 2A to FIG. 2K shows a method (step) for manufacturing the vertical type silicon carbide semiconductor device provided with the trench (see embodiment 1-1).

Figure 15:
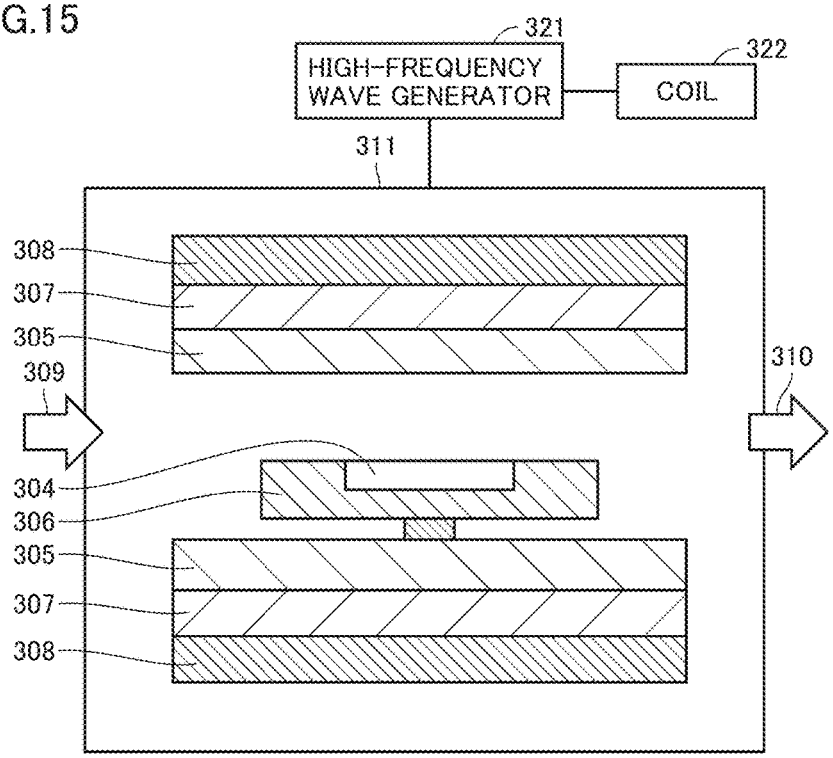
FIG. 15 is a schematic view of an annealing treatment device configured to perform annealing treatment according to the present disclosure.
Figure 16:
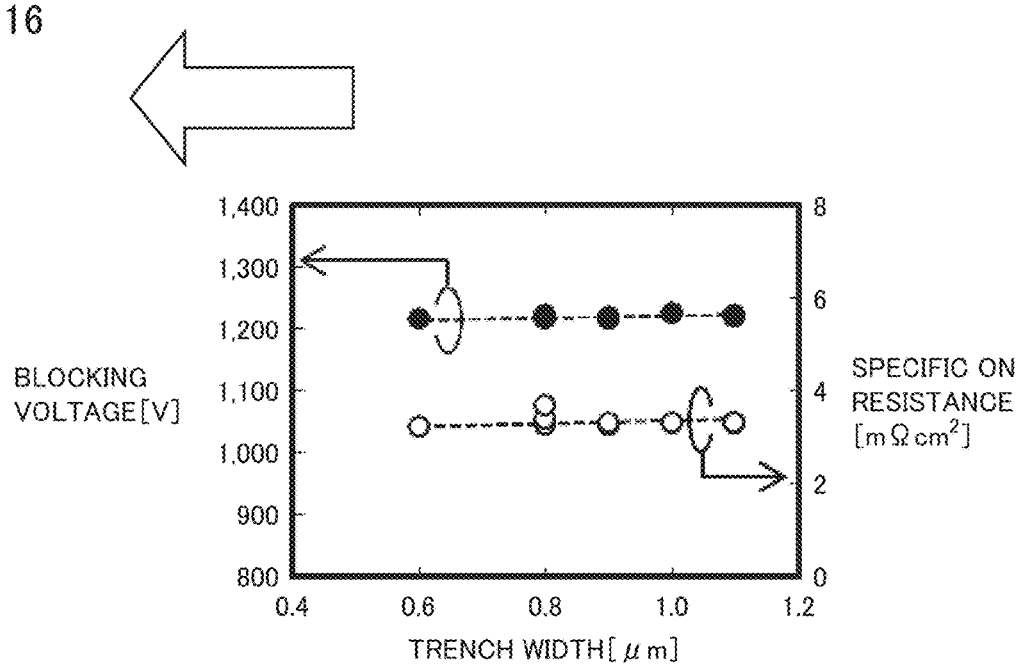
FIG. 16 shows a relation between a trench width and each of the breakdown voltage and the on resistance according to the present disclosure.

FIG. 15 shows a schematic view of an annealing treatment device 311 according to the present disclosure. The following describes an annealing treatment performed by this annealing treatment device.

In the step (FIG. 2I) of forming a trench in the SiC wafer including the vertical type silicon carbide semiconductor device, the SiC wafer processed to have the trench is placed in annealing treatment device 311 of FIG. 15 according to the present disclosure, and is subjected to the annealing treatment according to the present disclosure.

For the annealing, a SiC solid source is used and a damaged layer of a surface of the sample is removed to modify the surface. A cubic crystal solid source is more preferable than a hexagonal crystal solid source because a larger amount of Si can be supplied from the surface of the cubic crystal solid source.

Figure 20:
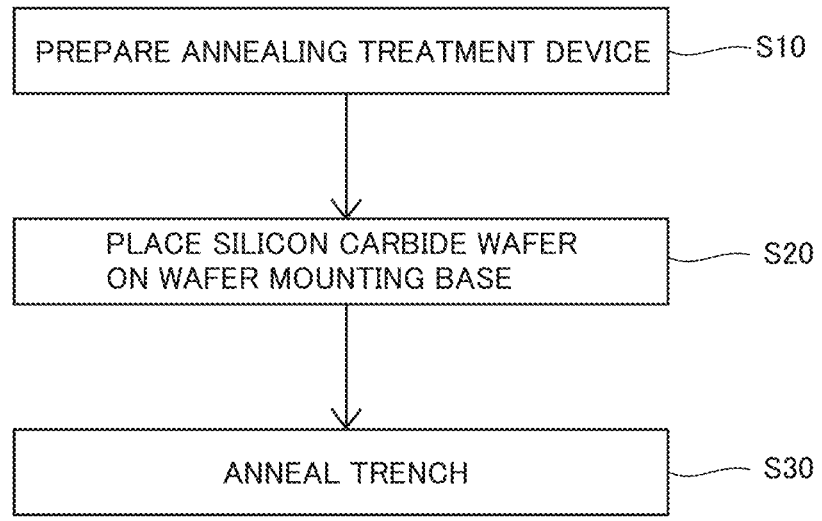
FIG. 20 is a flowchart showing a method for manufacturing a vertical type silicon carbide semiconductor device in a third embodiment.

First, annealing treatment device 311 of FIG. 15 is prepared (FIG. 20: S10). Annealing treatment device 311 has a chamber into which gas can be introduced and from which the gas can be discharged. In the chamber, a SiC wafer mounting base 306 and a carbon member 305 are disposed. Carbon member 305 is coated with a SiC applied member. SiC wafer mounting base 306 is constituted of a carbon member coated with a SiC applied member. Member 305 is coated with the SiC applied member having an area larger than the surface area of SiC wafer 304 so as to cover the upper and lower portions of mounting base 306 on which SiC wafer 304 is placed. Member 305 is configured to permit hydrogen gas to flow in and flow out therebetween. It should be noted that the SiC applied member refers to a member to which SiC is applied.

SiC wafer 304 provided with the trench and including the vertical type silicon carbide semiconductor device is placed on the SiC wafer mounting base 306 (FIG. 20: S20). Then, the chamber is vacuumed. After the vacuuming, the hydrogen gas is introduced into annealing treatment device 311 and the pressure of the chamber is fixed to 12 kPa while permitting the hydrogen gas to flow and adjusting a pump and an angle valve.

When the temperature of the chamber is increased to reach 1500° C., the temperature is held for 18 minutes (annealing treatment conditions: 1500° C.; 18 minutes; 12 kPa). By performing the hydrogen heat treatment onto SiC wafer 304 in the quasi-thermal equilibrium state, the side wall and bottom of the trench portion are smoothed and the shoulder of the trench can be rounded.

In other words, the silicon carbide applied member is etched by inductively heating the silicon carbide applied member in the quasi-thermal equilibrium state with the chamber being filled with the hydrogen gas and with the chamber being vacuumed, and the trench of the vertical type silicon carbide semiconductor device is annealed using silicon supplied from the silicon carbide applied member (FIG. 20: S30). The annealing treatment is performed at a temperature equal to or more than 1400° C. and equal to or less than 1600° C., for example.

Then, the temperature is decreased, the hydrogen gas is purged, and then the wafer is removed.

The silicon carbide semiconductor device trench structure to which the present disclosure is applied can be used for the silicon carbide semiconductor device described in the first embodiment of the invention of Japanese Patent Application No. 2014-134898 filed by the present discloser and illustrated in FIG. 1 of Japanese Patent Application No. 2014-134898, for example.

Moreover, the method for manufacturing the silicon carbide semiconductor device trench structure to which the present disclosure is applied can be applied as a part of or whole of the trench forming step, i.e., step S90 of the first embodiment of Japanese Patent Application No. 2014-134898, for example.

(Embodiment 3-2)

FIG. 15 shows a specific example of annealing treatment device 311 of the present disclosure.

Annealing treatment device 311 of the present disclosure includes: a container (chamber) having a space for heat treatment; a high-frequency wave generator 321; a coil 322 configured to emit a high-frequency wave generated by the high-frequency wave generator; a heated element or heated member (carbon member to which silicon carbide (SiC) is applied) inductively heated by the high-frequency wave; a gas supplier (not shown) configured to supply gas for the heat treatment; and a pump and an angle valve (not shown) each configured to control a pressure in the container.

In annealing treatment device 311, the gas (hydrogen) is supplied from the gas supplier, the heated member is inductively heated by the high-frequency wave, silicon carbide applied member 305 is etched to supply Si from silicon carbide applied member 305, and trench side wall 303 (see FIG. 14C) of SiC wafer 304 is annealed.

That is, the annealing treatment device for the trench of the vertical type silicon carbide semiconductor device includes the chamber into which the hydrogen gas can be introduced and from which the hydrogen gas can be discharged, the chamber being able to be vacuumed. In the chamber, the wafer mounting base constituted of the silicon carbide applied member is disposed. The silicon carbide applied member is disposed to cover the wafer mounting base from above and below. The silicon carbide applied member faces the wafer mounting base. The silicon carbide applied member is disposed to surround the wafer mounting base. The high-frequency wave generator and the coil inductively heat the silicon carbide applied member. Annealing treatment device 311 is configured to etch the silicon carbide applied member by inductively heating the silicon carbide applied member in the quasi-thermal equilibrium state with the chamber being filled with the hydrogen gas and the chamber being vacuumed and to anneal the trench using silicon (Si) supplied therefrom.

Figure 17A:
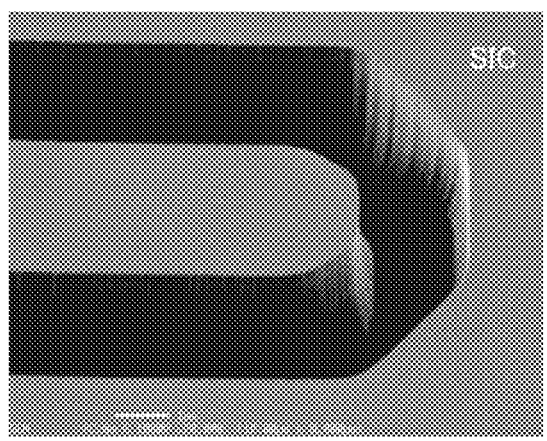
FIG. 17A shows an SEM image of the trench side wall having damage before performing annealing treatment according to the present disclosure.
Figure 17B:
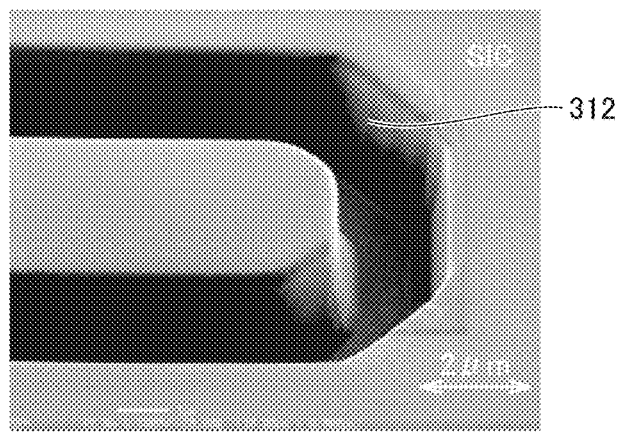
FIG. 17B shows an SEM image of the smooth trench side wall from which the damage has been removed after performing the annealing treatment according to the present disclosure using a solid SiC at a temperature of 1500° C.

FIG. 17A shows an SEM image of the trench side wall having damage caused during the trench formation before performing the annealing treatment. FIG. 17B shows an SEM image of the smoothed trench side wall from which the damage has been removed after performing the annealing treatment according to the present disclosure using the solid SiC at a temperature of 1500° C. When the trench side wall is seen, it is understood that the streak-like damage before the annealing treatment has been removed. In the method for manufacturing the semiconductor manufacturing device, by performing the annealing treatment in the quasi-thermal equilibrium state under the hydrogen atmosphere, the side wall and bottom portion of the trench can be smoothed and can be avoided from being rough, and the trench shoulder portion can be rounded at the same time.

(Embodiment 3-3)

The following describes an etching method in the trench forming step (FIG. 2I) according to embodiment 3-1. First, before performing the trench etching, silicon oxide ($SiO_2$) is deposited on the epitaxial layer as a mask pattern material for the trench etching through APCVD (Atmospheric Pressure Chemical Vapor Deposition), for example. The silicon oxide film is controlled to have a thickness of 1 μm, for example.

Next, a photoresist is applied onto the silicon oxide film and the pattern is exposed and developed, thereby providing an opening for the trench portion in the photoresist. The silicon oxide film is etched for the patterning of the trench opening using a mixed gas including $CF_4$ (carbon tetrafluoride), $CHF_3$ (trifluoromethane), $C_2F_6$ (ethane hexafluoride), $CCl_4$ (carbon tetrachloride), $H_2$ (hydrogen), or the like, for example. After the patterning of the silicon oxide film, the photoresist is removed using an oxygen asher or the like, for example. In this way, the pattern mask is provided on the silicon carbide wafer.

Using the silicon oxide as the pattern mask, the silicon carbide substrate is etched to provide the trench using a dry etching device.

The dry etching device employs ICP-RIE (Inductively Coupled Plasma Reactive Ion Etching). ICP can generate high-density plasma. The coil located above the wafer is controlled to generate inductively coupled plasma. Bias power is supplied to a holder onto which the silicon carbide wafer is electrostatically chucked. The bias power is supplied to cause a potential difference between the silicon carbide wafer and the upper coil so as to etch the silicon carbide substrate by the plasma.

In the trench etching device, silicon carbide is etched through the opening of the silicon oxide mask pattern using a chlorine-based gas or fluorine-based gas or a mixed gas including $O_2$ (oxygen) or the like, thereby providing the trench. Representative examples of the chlorine-based gas and the fluorine-based gas include $SF_6$ (sulfur hexafluoride), $SiCl_4$ (silicon tetrachloride), ($SiHCl_3$ (trichlorosilane), $SiH_2Cl_2$ (dichlorosilane), and $SiH_3Cl$ (monochlorosilane)).

In the embodiment, the fluorine-based gas was used and it was observed that a sub-trench suppressing thin film 302 is formed in the above-described gas, thereby suppressing a sub trench at the bottom of the trench. After forming the gate trench, the silicon oxide mask pattern is removed using an acid such as hydrofluoric acid.

Figure 21:
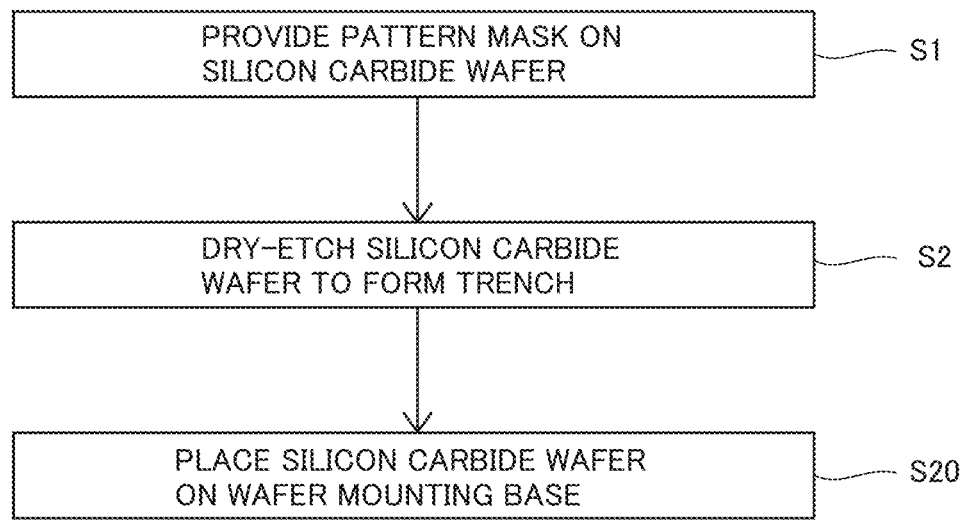
FIG. 21 is a flowchart showing a modification of the method for manufacturing the vertical type silicon carbide semiconductor device in the third embodiment.

In other words, before placing the silicon carbide wafer on the wafer mounting base, the pattern mask constituted of the silicon oxide thin film and provided with the opening is provided on the silicon carbide wafer (FIG. 21: S1). Next, the silicon carbide wafer is dry-etched through the opening under the predetermined gas in the quasi-thermal equilibrium state, thereby forming the trench (FIG. 21: S2). Upon the formation of the trench, the sub-trench suppressing thin film is formed to cover the side wall of the opening of the silicon oxide thin film and a flat portion of the silicon oxide thin film. Due to the sub-trench suppressing thin film, a sub trench is suppressed from being formed in the bottom of the trench.

Figure 14A:
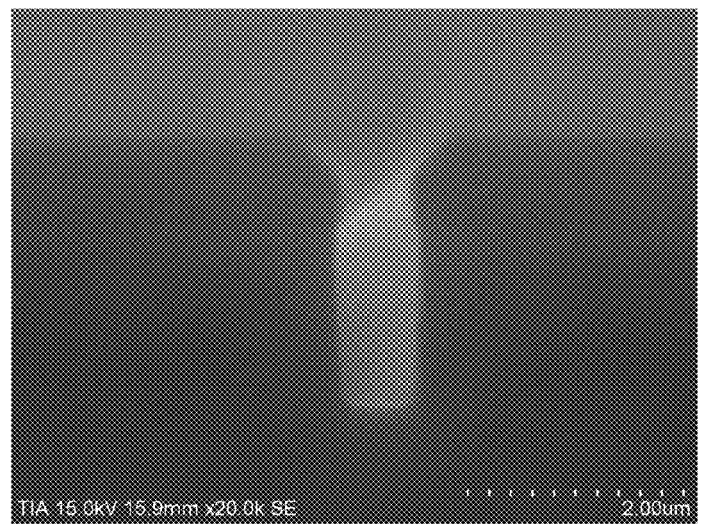
FIG. 14A shows a photograph of a cross section of the trench by a scanning electron microscope after the trench etching according to the present disclosure and before removing the mask.

FIG. 14A shows a photograph of a cross section of the trench by a scanning electron microscope after the trench etching according to the present disclosure and before removing the mask.

Figure 14B:
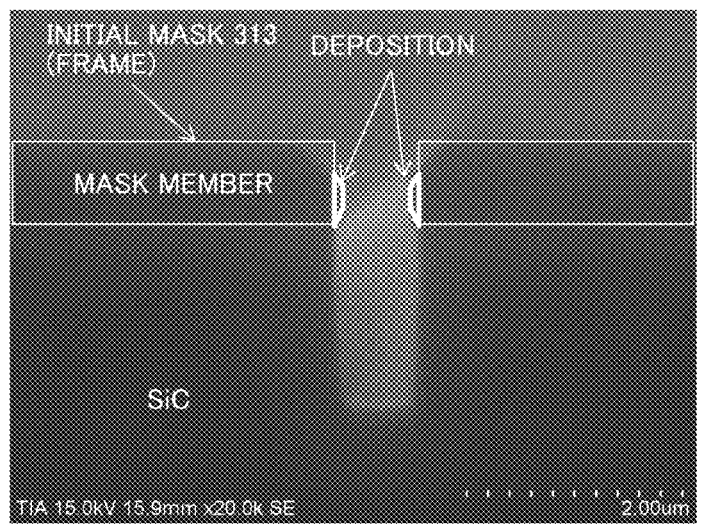
FIG. 14B is an explanatory view in which an initial mask 313 is superimposed on FIG. 14A.

With reference to FIG. 14B in which initial mask 313 is superimposed on FIG. 14A, it is understood that sub-trench suppressing thin film 302 is formed such that the side wall and flat portion of the opening are covered with the silicon oxide ($SiO_2$) thin film.

Figure 14C:
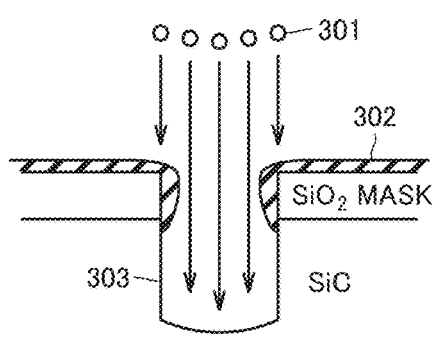
FIG. 14C is a conceptual view illustrating a sub-trench suppressing thin film in trench etching according to the present disclosure. For the scale of the photograph, one calibration marking corresponds to 0.2 µm and ten calibration markings correspond to 2.00 µm (the same applies to FIG. 18 and FIG. 19A to FIG. 19D).

FIG. 14C shows a conceptual view schematically illustrating the formation of the sub-trench suppressing thin film during the trench etching according to the present disclosure.

Table 1 shows reaction formulas for silicon carbide applied member 305 and silicon carbide (SiC) wafer mounting base 306 under the hydrogen gas atmosphere in the annealing treatment after the trench etching process.

TABLE 1

| Reaction Formula |
| --- |
| $2SiC + H_2 \rightarrow 2Si + C_2H_2$ |
| $C_2H_2 \rightarrow 2C + H_2$ |
| $SiC + C \rightarrow SiC_2$ |

SiC reacts with hydrogen to generate Si and a hydrocarbon compound such as $C_2H_2$, with the result that Si leaves from the SiC surface. In the conventional art, for example, Si may be generated through reaction with supplied $SiH_4$ (silane gas) or the like; however, in the present embodiment, Si is generated through reaction with the SiC solid source and the trench surface is processed in the quasi-thermal equilibrium state.

In the present embodiment, the process was performed with a trench mask width of 0.6 μm. In this case, it was confirmed that the transistor was operated.

Figure 18:
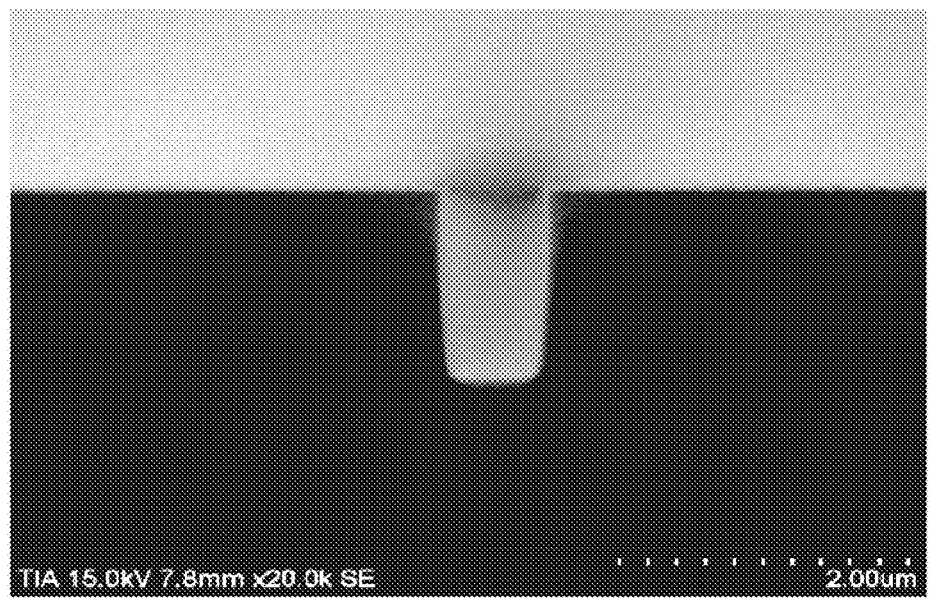
FIG. 18 shows a photograph of a cross section of the trench by a scanning electron microscope after the trench process.

FIG. 18 shows a photograph of a cross section thereof by a scanning electron microscope after the trench process. The trench process was performed with the trench mask width of 0.6 μm and the trench width after removing the mask was 0.7 μm.

Each of FIG. 19A to FIG. 19D shows a photograph of a cross section by a scanning electron microscope in the case of performing the annealing treatment under each of the following conditions in Table 2 after the trench process.

TABLE 2

Figure 19A:
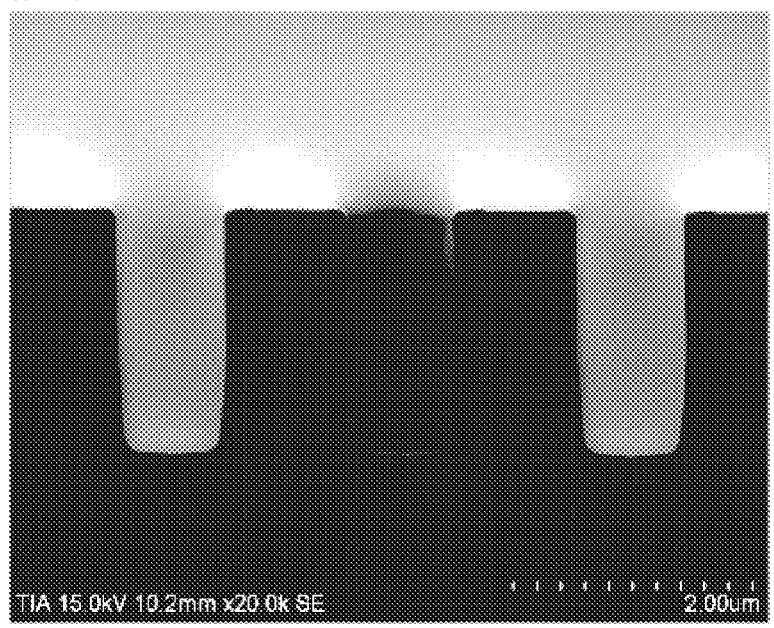
FIG. 19A shows a photograph of a cross section of the trench annealed under conditions for a sample 1 in Table 2 after the trench process, by a scanning electron microscope.
Figure 19B:
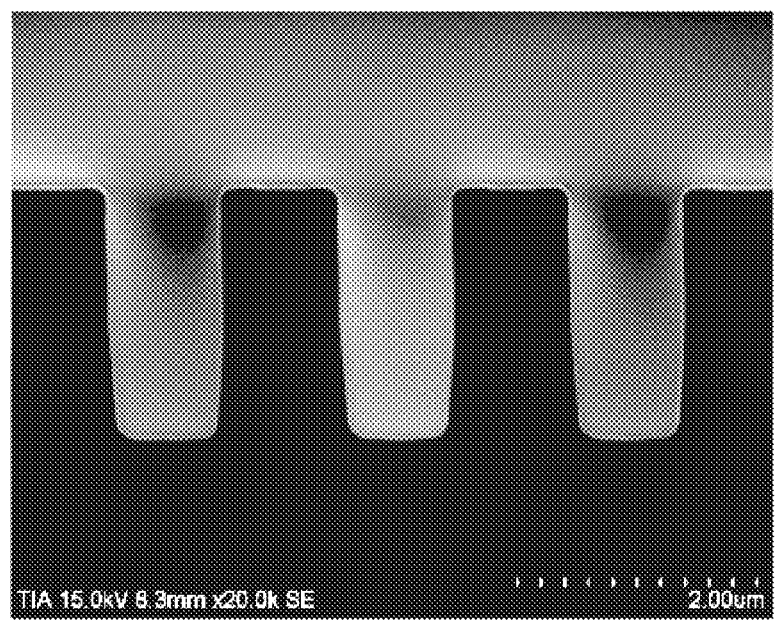
FIG. 19B shows a photograph of a cross section of the trench annealed under conditions for a sample 2 in Table 2 after the trench process, by a scanning electron microscope.
Figure 19C:
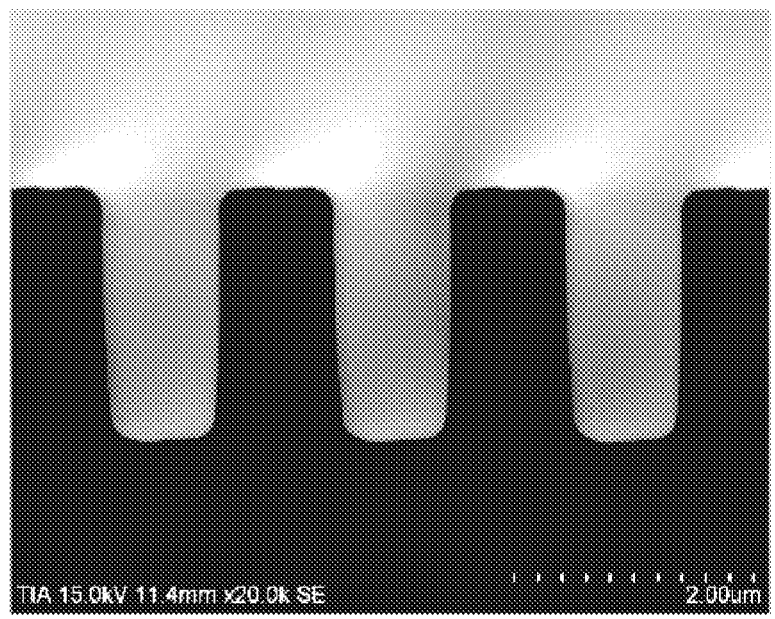
FIG. 19C shows a photograph of a cross section of the trench annealed under conditions for a sample 3 in Table 2 after the trench process, by a scanning electron microscope.
Figure 19D:
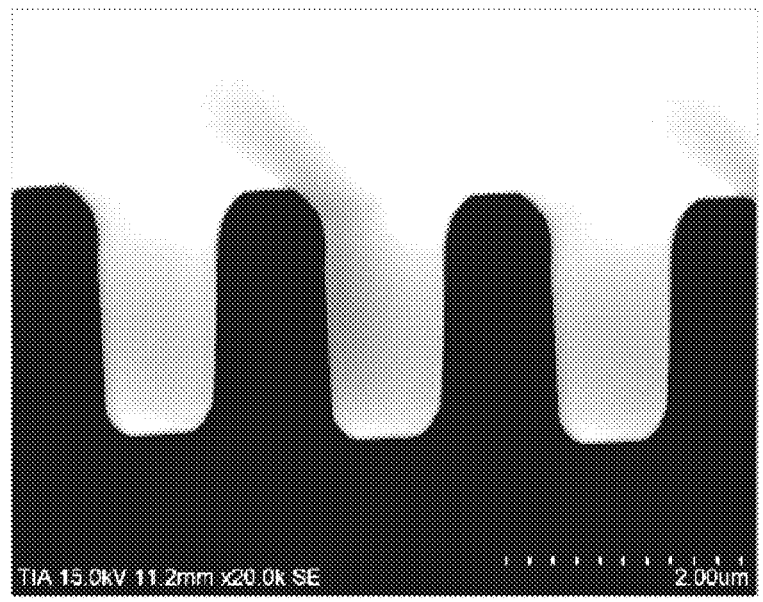
FIG. 19D shows a photograph of a cross section of the trench annealed under conditions for a sample 4 in Table 2 after the trench process, by a scanning electron microscope.

| | Corresponding Figure | Treatment Temperature | Treatment Time | Treatment Pressure | Curvature Radius of Upper Corner of Trench |
| --- | --- | --- | --- | --- | --- |
| Sample 1 | FIG. 19A | 1350° C. | 18 minutes | 12 kPa | 0.07 μm |
| Sample 2 | FIG. 19B | 1400° C. | 18 minutes | 12 kPa | 0.09 μm |
| Sample 3 | FIG. 19C | 1500° C. | 18 minutes | 12 kPa | 0.15 μm |
| Sample 4 | FIG. 19D | 1605° C. | 18 minutes | 12 kPa | 0.36 μm |

The process was performed with a trench mask width of 1 μm. In the case of sample 3 (FIG. 19C), the curvature radius of the upper corner of the trench after the trench annealing treatment was 0.15 μm. In the case of each of sample 3 and sample 4 of Table 2, it is understandable that the trench upper corner was apparently rounded. In the case of sample 4 in which the treatment was performed at 1605° C., the curvature radius of the upper corner of the trench became large, with the result that the source portion, which was the region of the upper corner of the trench, was also removed undesirably. Moreover, in the case of sample 1 performed at 1350° C., the side wall and bottom portion of the trench were not smoothed undesirably. Therefore, the treatment is preferably performed at equal to or more than 1400° C. and equal to or less than 1600° C., preferably, at 1500° C.

There is a conventional example in which the width of the opening of the trench is about 1 μm (Fuji Electric Journal Vol. 81, No. 6 (2008) p454 (74)). In the conventional art, generally, as the trench width becomes narrower, it is considered difficult to supply a sufficient amount of gas into the narrow trench due to the narrow trench width even when $SiH_4$ (silane gas) or the like is supplied, for example.

On the other hand, when a silicon carbide solid source material is used as in the present embodiment, even though the trench width is narrow, the side wall of the trench can be smoothed because the workpiece is also a silicon carbide material, i.e., because it is thermodynamically in the quasi-thermal equilibrium state. For example, even when the trench has a trench width of 0.2 μm, the side wall of the trench can be considered to be smoothed.

<Clauses for First Embodiment>

(Clause 1)

A silicon carbide trench type MOSFET comprising:

a substrate (1) composed of silicon carbide and having a first conductivity type;

a drift layer (2) formed on the substrate, the drift layer (2) being composed of silicon carbide having a low impurity concentration and having the first conductivity type;

a first base region (3) formed on the drift layer (2), the first base region (3) being divided into portions located at both ends and a center, the first base region (3) being composed of silicon carbide having a second conductivity type and having a high impurity concentration;

a current diffusion layer (4) interposed between the divided portions of the first base regions (3);

a trench current diffusion layer (5) formed on the first base region (3) and the current diffusion layer (4), the trench current diffusion layer (5) being composed of silicon carbide having the first conductivity type and having a high impurity concentration;

a second base region (6) formed adjacent to both ends of the trench current diffusion layer (5), the second base region (6) being composed of silicon carbide having the second conductivity type and having a high impurity concentration;

a body region (7) formed on the trench current diffusion layer (5) and the second base region (6), the body region (7) being composed of silicon carbide having the second conductivity type;

a source region (8) formed on the body region (7), the source region (8) being composed of silicon carbide having the first conductivity type and having a high impurity concentration;

a contact region (9) formed adjacent to both ends of the body region (7), the contact region (9) having a same height as a height of the source region (8), the contact region (9) being composed of silicon carbide having the second conductivity type and having a high impurity concentration;

a trench (10) formed to extend substantially perpendicularly from a surface of the source region (8) to the trench current diffusion layer (5) through the source region (8) and the body region (7);

a gate insulating oxide film (11) formed to cover an inner wall surface of the trench (10) and a portion of the source region (8);

a gate electrode (12) formed in the gate insulating oxide film (11) within the trench (10);

a source electrode (13) that covers a portion of the source region (8) and the contact region (9), the source electrode (13) being electrically connected to the body region (7); and a drain electrode (14) formed on a backside surface of the substrate (1), the trench (10) having a bottom surface that is separated from and overlaps with the center portion (3a) of the divided first base region (3) in the perpendicular direction, a width of the center portion (3a) in a horizontal direction being larger than a width of the bottom of the trench (10).

(Clause 2)

The silicon carbide trench type MOSFET according to clause 1, wherein the bottom surface of the trench (10) is separated from the center portion (3a) of the divided first base region (3) by 0.05 μm to 0.5 μm in the perpendicular direction.

(Clause 3)

The silicon carbide trench type MOSFET according to clause 2, wherein the width of the center portion (3a) in the horizontal direction is larger than the width of the bottom surface of the trench (10) by 0.1 μm to 0.5 μm.

(Clause 4)

The silicon carbide trench type MOSFET according to clause 3, wherein the impurity concentration of the current diffusion layer (4) is $1.0 \times 10^{16}$ $cm^{-3}$ to $4.0 \times 10^{17}$ $cm^{-3}$, the respective widths of the center portion (3a) of the first base region (3), the portions of the first base region (3) adjacent to the both ends, and the current diffusion layer (4) in the horizontal direction are 0.7 μm to 1.5 μm.

(Clause 5)

The silicon carbide trench type MOSFET according to clause 4, wherein a thickness of the body region (7) in the perpendicular direction is 0.5 μm to 1.5 μm, and the concentration of the body region (7) is $1.0 \times 10^{16}$ $cm^{-3}$ to $3.0 \times 10^{17}$ $cm^{-3}$, a thickness of the source region in the perpendicular direction is 0.1 μm to 0.4 μm, and the concentration of the source region is $2.0 \times 10^{18}$ $cm^{-3}$ to $1.0 \times 10^{20}$ $cm^{-3}$, and a thickness of the trench current diffusion layer (5) in the perpendicular direction is 0.3 μm to 1.0 μm, and the concentration of the trench current diffusion layer (5) is $5.0 \times 10^{16}$ $cm^{-3}$ to $1.0 \times 10^{17}$ $cm^{-3}$.

(Clause 6)

The silicon carbide trench type MOSFET according to any one of clause 2 to clause 5, wherein a separation distance (22) between the first base region center portion (3a) and each of the first base region left end portion (3b) and right end portion (3c) with the current diffusion layer (4) being interposed therebetween is larger than a separation distance (23) between the first base region center portion (3a) and the end portion of the second base region (6) in the horizontal direction with the current diffusion layer (4) being interposed therebetween, and a difference between the separation distance (22) and the separation distance (23) is equal to or more than 0.2 μm and is equal to or less than the thickness of the first base region and equal to or less than 0.6 μm.

(Clause 7)

The silicon carbide trench type MOSFET according to clause 6, wherein the first base region center portion (3a) is connected cyclically to each of the first base region left end portion (3b) and right end portion (3c) in the long side direction by the first base region connection portions (3d).

(Clause 8)

The silicon carbide trench type MOSFET according to clause 7, wherein a connection interval between the first base region connection portions (3d) adjacent to each other in the long side direction is equal to or more than 10 µm and equal to or less than 200 µm.

<Clauses for Second Embodiment>

(Clause 1)

An outer circumferential termination structure of a semiconductor device having a surface outer circumferential portion provided with an electric field relaxing layer for maintaining breakdown voltage, the outer circumferential termination structure comprising:

a drift layer (3) constituted of a first conductivity type thin film;

a high-concentration layer (1), a first electric field relaxing layer (4), a second electric field relaxing layer (5), and an electric field diffusion layer (7), which are formed on the drift layer (3), are constituted of a second conductivity type thin film, are continuous to one another, and have different concentrations such that the concentrations are lower toward the outer circumference of the semiconductor device; and a channel stop layer (6) located at an ultimate end of the surface outer circumference portion, the channel stop layer (6) being connected to the electric field diffusion layer (7), the channel stop layer (6) having a concentration higher than the concentration of the drift layer (3), the channel stop layer (6) having the first conductivity type.

(Clause 2)

An outer circumferential termination structure of a semiconductor device having a surface outer circumferential portion provided with an electric field relaxing layer for maintaining breakdown voltage, the outer circumferential termination structure comprising:

a drift layer (3) constituted of a first conductivity type thin film;

a high-concentration layer (1), a first electric field relaxing layer (4), a second electric field relaxing layer (5), a third electric field relaxing layer, and an electric field diffusion layer (7), which are formed on the drift layer (3), are constituted of a second conductivity type thin film, are continuous to one another, and have different concentrations such that the concentrations are lower toward the outer circumference of the semiconductor device; and a channel stop layer (6) located at an ultimate end of the surface outer circumference portion, the channel stop layer (6) being connected to the electric field diffusion layer (7), the channel stop layer (6) having a concentration higher than the concentration of the drift layer (3), the channel stop layer (6) having the first conductivity type.

(Clause 3)

The outer circumferential termination structure according to clause 1 or clause 2, further comprising a first conductivity type electric field diffusion layer (10) between the drift layer (3) and the second conductivity type thin film, the first conductivity type electric field diffusion layer (10) being constituted of a first conductivity type thin film having a higher concentration than the concentration of the drift layer (3).

(Clause 4)

The outer circumferential termination structure according to any one of clause 1 to clause 3, wherein each of the first electric field relaxing layer (4), the second electric field relaxing layer (5), and the third electric field relaxing layer further includes an embedded structure spatially modulated to gradually cease to exist toward the outer circumference at least in the electric field relaxing layer or the electric field diffusion layer (7) circumferentially outwardly adjacent to the first electric field relaxing layer (4), the second electric field relaxing layer (5), and the third electric field relaxing layer.

(Clause 5)

The outer circumferential termination structure according to any one of clause 1 to clause 3, wherein the semiconductor device is a SiC semiconductor element provided with a trench, the first conductivity type thin film constituting the drift layer (3) is the first conductivity type thin film constituting the drift layer (52) of the SiC semiconductor element, and the second conductivity type thin film is the second conductivity type thin film constituting the body region (57) of the SiC semiconductor element.

(Clause 6)

The outer circumferential termination structure according to clause 5, wherein the high-concentration thin film constituting the first conductivity type electric field diffusion layer (10) is the first conductivity type low-concentration thin film constituting the trench current diffusion layer (55) of the SiC semiconductor element.

<Clauses for Third Embodiment>

(Clause 1)

An annealing treatment device for a trench of a vertical type silicon carbide semiconductor device, the annealing treatment device comprising:

a chamber into which hydrogen gas is able to be introduced and from which the hydrogen gas is able to be discharged, the chamber being able to be vacuumed, a wafer mounting base constituted of a silicon carbide (SiC) applied member being disposed in the chamber, a silicon carbide (SiC) applied member being disposed to cover the wafer mounting base from above and below; and a high-frequency wave generator and a coil each configured to inductively heat the silicon carbide (SiC) applied member, the silicon carbide (SiC) applied member being etched by inductively heating the silicon carbide (SiC) applied member in a quasi-thermal equilibrium state with the chamber being filled with the hydrogen gas and with the chamber being vacuumed, the trench being annealed using supplied resultant silicon (Si).

(Clause 2)

An annealing treatment method for a trench of a vertical type silicon carbide semiconductor device, a chamber into which hydrogen gas is able to be introduced and from which the hydrogen gas is able to be discharged being provided, the chamber being able to be vacuumed, a wafer mounting base constituted of a silicon carbide (SiC) applied member being disposed in the chamber, a silicon carbide (SiC) applied member being disposed to cover the wafer mounting base from above and below; and a high-frequency wave generator and a coil being provided, the high-frequency wave generator and the coil being each configured to inductively heat the silicon carbide (SiC) applied member, the annealing treatment method comprising:

placing a silicon carbide wafer on the wafer mounting base, the silicon carbide wafer including a vertical type silicon carbide semiconductor device provided with a trench; and etching the silicon carbide (SiC) applied member by inductively heating the silicon carbide (SiC) applied member in a quasi-thermal equilibrium state with the chamber being filled with the hydrogen gas and with the chamber being vacuumed, and annealing the trench of the vertical type silicon carbide semiconductor device of the silicon carbide wafer using supplied resultant silicon (Si).

(Clause 3)

The annealing treatment method for the trench of the vertical type silicon carbide semiconductor device according to clause 2, wherein the annealing is performed at a temperature of 1400° C. to 1600° C.

(Clause 4)

The annealing treatment method for the trench of the vertical type silicon carbide semiconductor device according to clause 3, wherein in the silicon carbide wafer including the vertical type silicon carbide semiconductor device provided with the trench, when forming the trench by providing a pattern mask of a silicon oxide ($SiO_2$) thin film in conformity with a trench portion to serve as an opening of the trench and by dry-etching the opening in the quasi-thermal equilibrium state under a predetermined gas, the trench is formed such that occurrence of a sub trench at a bottom of the trench is suppressed by a sub-trench suppressing thin film formed under the predetermined gas to cover side wall and flat portion of the opening in the silicon oxide ($SiO_2$) thin film.

(Clause 5)

A vertical type silicon carbide semiconductor device manufactured by the annealing treatment method for the trench of the vertical type silicon carbide semiconductor device as recited in clause 2 or clause 3, the vertical type silicon carbide semiconductor device being provided with a trench having a trench width equal to or more than 0.5 μm.

(Clause 6)

The vertical type silicon carbide semiconductor device according to clause 5, wherein a curvature radius of an upper corner of the trench is equal to or more than 0.1 μm.

(Clause 7)

The vertical type silicon carbide semiconductor device according to clause 4, wherein the trench is provided to have a trench width equal to or more than 0.2 μm and equal to or less than 0.6 μm.

(Clause 8)

The vertical type silicon carbide semiconductor device according to clause 7, wherein there is no damage in a wall surface of the trench.

(Clause 9)

A vertical type silicon carbide semiconductor device provided with a trench, the trench width being equal to or more than 0.2 μm and equal to or less than 0.6 μm, a curvature radius of an upper corner of the trench being equal to or more than 0.1 μm, there being no damage in a wall surface of the trench.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

100: silicon carbide semiconductor device; 101: substrate; 102: drift layer; 103: first base region (PBA1); 103a: first base region center portion; 103b: first base region left end portion; 103c: first base region right end portion; 103d: first base region connection portion; 104: current diffusion layer; 105: trench current diffusion layer; 106: second base region (PBA2); 107: body region; 108: source region; 109: contact region; 110: trench; 111: insulating oxide film (gate insulating film); 112: gate electrode; 113: source electrode; 114: drain electrode; 115: TEOS oxide film; 116: oxide mask; 117: gate oxide film; 118: interlayer insulating film; 119: interconnection; 120: protective film; 121: width of the first base region center portion; 122: separation distance between the first base region center portion and the first base region left end portion or right end portion; 123: separation distance between the first base region center portion and the second base region end portion in horizontal direction; 124: distance between the first base region connection portions (inward direction) (grounding pitch); 201: high-concentration layer (P++ layer; active portion boundary region formed in an active portion boundary region); 202: high-concentration layer (P++ layer; active portion boundary region formed in the drift layer); 203: drift layer; 204: first electric field relaxing layer; 204a; 204b; 204c; 204d: spatially modulated first electric field relaxing layer; 205: second electric field relaxing layer; 205a, 205b, 205c, 205d: spatially modulated second electric field relaxing layer; 206: channel stop layer (N+ layer); 207: p− electric field diffusion layer; 208: high-concentration layer (P++ layer; active portion boundary region formed in the drift layer); 209: high-concentration layer (P++ layer; active portion boundary region formed in the N layer); 210: n electric field diffusion layer; 211: boundary portion in the conventional structure; 212: boundary portion in the novel structure; 213: boundary portion with an electric field concentrate in the conventional structure; 214: boundary portion with electric field relaxation in the novel structure; 301: active species (radicals); 302: sub-trench suppressing thin film; 303: trench side wall (wall surface); 304: silicon carbide (SiC) wafer; 305: carbon member to which silicon carbide (SiC) is applied (silicon carbide applied member); 306: silicon carbide (SiC) wafer mounting base; 307: heat insulator; 308: quartz ($SiO_2$); 309: gas introduction path; 310: gas discharging path; 311: annealing treatment device; 312: trench side wall; 313: initial mask (frame); 321: high-frequency wave generator; 322: coil.

The invention claimed is:

1. A silicon carbide semiconductor device comprising:
a substrate having a first conductivity type and composed of silicon carbide;
a drift layer provided on the substrate, the drift layer having the first conductivity type, the drift layer being composed of silicon carbide;
a first base region provided on the drift layer, the first base region being divided into a center portion and side portions adjacent to both sides of the center portion, the first base region having a second conductivity type, the first base region being composed of silicon carbide;
a current diffusion layer interposed between the divided portions of the first base region;
a trench current diffusion layer provided on the first base region and the current diffusion layer, the trench current diffusion layer having the first conductivity type, the trench current diffusion layer being composed of silicon carbide, a second base region provided adjacent to both sides of the trench current diffusion layer, the second base region having the second conductivity type, the second base region being composed of silicon carbide;

a body region provided on the trench current diffusion layer and the second base region, the body region having the second conductivity type, the body region being composed of silicon carbide;

a source region provided on the body region, the source region having the first conductivity type, the source region being composed of silicon carbide;

a contact region having the second conductivity type, the contact region being composed of silicon carbide;

a trench provided to extend from a surface of the source region to the trench current diffusion layer through the source region and the body region;

a gate insulating oxide film provided to cover an inner wall surface of the trench and a portion of the source region;

a gate electrode provided in the trench;

a source electrode that covers a portion of the source region and the contact region, the source electrode being electrically connected to the body region; and a drain electrode provided on a backside surface of the substrate, the trench having a bottom surface that is separated from and overlaps with the center portion of the first base region in a perpendicular direction, a width of the center portion in a horizontal direction being larger than a width of the bottom surface of the trench.

2. The silicon carbide semiconductor device according to claim 1, wherein the bottom surface of the trench is separated from the center portion by equal to or more than 0.05 µm and equal to or less than 0.5 µm in the perpendicular direction.

3. The silicon carbide semiconductor device according to claim 2, wherein the width of the center portion in the horizontal direction is larger than the width of the bottom surface of the trench by equal to or more than 0.1 µm and equal to less than 0.5 µm.

4. The silicon carbide semiconductor device according to claim 3, wherein an impurity concentration of the current diffusion layer is equal to or more than $1.0 \times 10^{16}$ cm$^{-3}$ and equal to or less than $4.0 \times 10^{17}$ cm$^{-3}$, a width of the current diffusion layer in the horizontal direction between the center portion and each of the side portions of the first base region is equal to or more than 0.7 µm and equal to or less than 1.5 µm.

5. The silicon carbide semiconductor device according to claim 4, wherein a thickness of the body region in the perpendicular direction is equal to or more than 0.5 µm and equal to or less than 1.5 µm, and an impurity concentration of the body region is equal to or more than $1.0 \times 10^{16}$ cm$^{-3}$ and equal to or less than $3.0 \times 10^{17}$ cm$^{-3}$, a thickness of the source region in the perpendicular direction is equal to or more than 0.1 µm and equal to or less than 0.4 µm, and an impurity concentration of the source region is equal to or more than $2.0 \times 10^{18}$ cm$^{-3}$ and equal to or less than $1.0 \times 10^{20}$ cm$^{-3}$, and a thickness of the trench current diffusion layer in the perpendicular direction is equal to or more than 0.3 µm and equal to or less than 1.0 µm, and an impurity concentration of the trench current diffusion layer is equal to or more than $5.0 \times 10^{16}$ cm$^{-3}$ and equal to or less than $1.0 \times 10^{17}$ cm$^{-3}$.

6. The silicon carbide semiconductor device according to claim 4, wherein a first separation distance between the center portion of the first base region and each of the side portions of the first base region in the horizontal direction is larger than a second separation distance between the center portion of the first base region and an end portion of the second base region in the horizontal direction, and a difference between the first separation distance and the second separation distance is equal to or more than 0.2 µm and is equal to or less than a thickness of the first base region and equal to or less than 0.6 µm.

7. The silicon carbide semiconductor device according to claim 6, wherein the center portion of the first base region is connected to each of the side portions of the first base region by first base region connection portions, and the first base region connection portions are cyclically provided in a long side direction of the first base region.

8. The silicon carbide semiconductor device according to claim 7, wherein an interval between two adjacent first base region connection portions of the first base region connection portions in the long side direction is equal to or more than 10 µm and equal to or less than 200 µm.

* * * * *